(12) United States Patent
Lim et al.

(10) Patent No.: US 12,174,260 B2
(45) Date of Patent: Dec. 24, 2024

(54) VOLTAGE MONITORING CIRCUIT

(71) Applicant: LG INNOTEK CO., LTD., Seoul (KR)

(72) Inventors: In Seok Lim, Seoul (KR); Seong Hun Kim, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 334 days.

(21) Appl. No.: 17/778,913

(22) PCT Filed: Nov. 17, 2020

(86) PCT No.: PCT/KR2020/016205
§ 371 (c)(1),
(2) Date: May 23, 2022

(87) PCT Pub. No.: WO2021/112452
PCT Pub. Date: Jun. 10, 2021

(65) Prior Publication Data
US 2022/0404421 A1 Dec. 22, 2022

(30) Foreign Application Priority Data

Dec. 3, 2019 (KR) .................. 10-2019-0159168
Jan. 2, 2020 (KR) .................. 10-2020-0000171

(51) Int. Cl.
*G01R 31/3835* (2019.01)
*G01R 15/04* (2006.01)
*G01R 19/165* (2006.01)
*G05F 3/26* (2006.01)
*H02H 3/087* (2006.01)

(52) U.S. Cl.
CPC ......... *G01R 31/3835* (2019.01); *G01R 15/04* (2013.01); *G01R 19/16519* (2013.01); *G05F 3/26* (2013.01); *H02H 3/087* (2013.01)

(58) Field of Classification Search
CPC .............. H02J 7/0029–0032; G01R 31/00–74; H02H 3/087
See application file for complete search history.

(56) References Cited

U.S. PATENT DOCUMENTS

2007/0263420 A1* 11/2007 Nate ................... H02J 7/06
363/125
2014/0055095 A1* 2/2014 Kim ................... H02J 7/0031
320/134
2016/0156204 A1* 6/2016 Kim ................... H02J 7/00304
320/134

FOREIGN PATENT DOCUMENTS

JP 2000-193694 7/2000
JP 2002-189041 7/2002
(Continued)

OTHER PUBLICATIONS

International Search Report dated Feb. 19, 2021 issued in Application No. PCT/KR2020/016205.

*Primary Examiner* — Jared Fureman
*Assistant Examiner* — Christopher J Clark
(74) *Attorney, Agent, or Firm* — KED & ASSOCIATES, LLP

(57) ABSTRACT

The voltage monitoring circuit according to one embodiment of the present invention comprises: a clamping unit for clamping the voltage of input power supplied from a power source to base voltage, and outputting to an MCU; and a switch unit for cutting off the input power from the power source if an anomaly occurs with the base voltage of the clamping unit.

20 Claims, 18 Drawing Sheets

(56) References Cited

FOREIGN PATENT DOCUMENTS

| | | |
|---|---|---|
| JP | 2007-306664 | 11/2007 |
| JP | 2019-148478 | 9/2019 |
| KR | 10-2012-0129707 | 11/2012 |

* cited by examiner 1001  1002

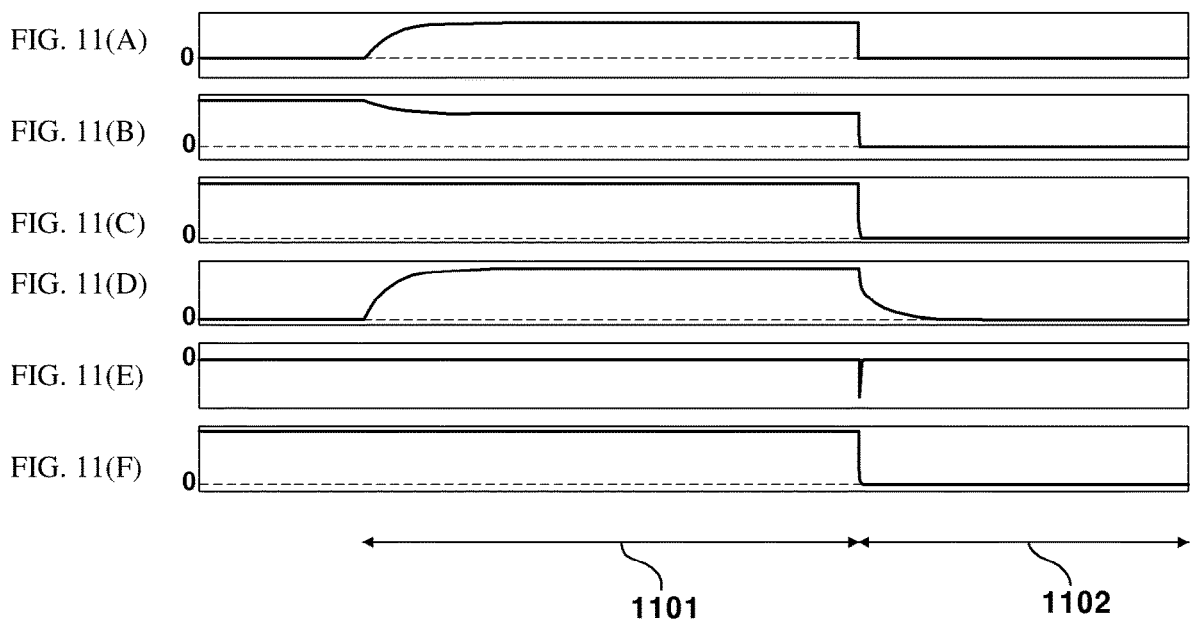
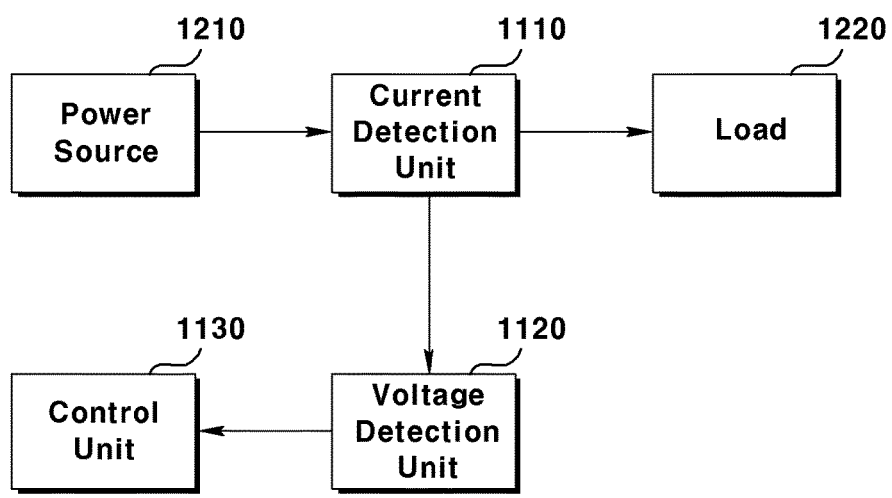

1000

VOLTAGE MONITORING CIRCUIT

CROSS-REFERENCE TO RELATED PATENT APPLICATIONS

This application is a U.S. National Stage Application under 35 U.S.C. § 371 of PCT Application No. PCT/KR2020/016205, filed Nov. 17, 2020, which claims priority to Korean Patent Application Nos. 10-2019-0159168, filed Dec. 3, 2019 and 10-2020-0000171, filed Jan. 2, 2020, whose entire disclosures are hereby incorporated by reference.

TECHNICAL FIELD

The present invention relates to a voltage monitoring circuit, and more specifically, relates to: a voltage monitoring circuit that blocks the input power being monitored when an abnormality occurs in the reference voltage used for voltage monitoring; an over current protection circuit to protect the control unit from over current by limiting the output voltage; and an over current protection method.

BACKGROUND ART

A vehicle needs to not only operate the motor of the vehicle using the battery power installed in the vehicle, but also supply a stable voltage required for communication drivers, sensors, and various controllers.

The voltage output from the battery may be different depending on the type of vehicle, for example, a small vehicle or a large vehicle, and the voltage outputted from the battery may continuously change according to the use of a battery power source. However, it is necessary to supply a stable voltage required by each device inside the vehicle regardless of the magnitude of the voltage outputted by the battery.

At this time, a voltage monitoring circuit that detects and monitors the degree of the voltage that is actually outputted by the battery is used. At this time, when the voltage actually outputted by the battery is not within a preset range or the circuit monitoring the battery voltage does not operate normally, it is necessary to prevent malfunctions in other components connected to the voltage monitoring circuit.

In addition, if an over current occurs while receiving the battery power source, damage may occur to circuits or components inside the vehicle. In order to prevent such damage, the control unit monitors the current input from the battery power source. In the case when a large over current occurs while the control unit measures the current being inputted from the battery power source, there is a problem that the control unit that measures the current being inputted from the battery power source may also be damaged.

Therefore, there is a need for an over current protection circuit that can safely measure current and protect internal circuits or components even when over current occurs.

DETAILED DESCRIPTION OF THE INVENTION

Technical Subject

The technical problem to be solved by the present invention is to provide a voltage monitoring circuit that blocks an input power being monitored when an abnormality occurs in a reference voltage used for voltage monitoring.

In addition, another technical problem to be solved by the present invention is to provide an over current protection circuit that detects a current and limits an output voltage to protect a control unit from over current.

The problems of the present invention are not limited to the problems mentioned above, and other problems not mentioned will be clearly understood by those skilled in the art from the following description.

Technical Solution

In order to solve the above technical problem, the voltage monitoring circuit according to an embodiment of a first embodiment of the present invention comprises: a clamping unit that clamps the voltage of an input power inputted from a power source as a reference voltage and outputs it to an MCU; and a switch unit that blocks the input power from the power source when an abnormality occurs in the reference voltage of the clamping unit.

In addition, the clamping unit may receive a reference voltage having a predetermined voltage level from a voltage supply unit.

In addition, the switch unit may block an input power from the power source to block application of the power source to the voltage supply unit.

In addition, it may further include a voltage divider unit connected to a front end of the clamping unit to divide the voltage of the input power.

In addition, it may further include a low pass filter connected to a front end of the clamping unit to filter the input power.

In addition, the switch unit may be composed of a transistor or a MOSFET.

In addition, the power source may be a battery power.

In order to solve the above technical problem, a voltage monitoring circuit according to another embodiment of the first embodiment of the present invention is characterized by comprising: a first power input unit and a second power input unit receiving a battery power; a first switch unit connected to the first power input unit, and a second switch unit connected to the second power input unit; and a first clamping unit for clamping the voltage of the input power being inputted through the first power input unit and the first switch unit to a reference voltage, and a second clamping unit clamping the voltage of the input power being inputted through the second power input unit and the second switch unit to a reference voltage, wherein the first switch unit blocks the input power from the first power input unit when an abnormality occurs in the reference voltage of the first clamping unit, and wherein the second switch unit blocks the input power from the second power input unit when an abnormality occurs in the reference voltage of the second clamping unit.

In addition, the first clamping unit and the second clamping unit may receive a reference voltage having a predetermined voltage level from a voltage supply unit through a separate connection line.

In addition, the first switch unit is configured as a transistor, and the second switch unit may be configured as a MOSFET.

In addition, the first switch unit is configured as a MOSFET, and the second switch unit may be configured as a transistor.

In addition, by comparing the voltage clamped in the first clamping unit with the voltage clamped in the second clamping unit, it is determined whether an abnormality occurs in the reference voltage of the first clamping unit or the reference voltage of the second clamping unit; and when an abnormality occurs in the reference voltage of the first clamping unit or the reference voltage of the second clamping unit, the first switch unit or the second switch unit connected to the clamping unit having an abnormality in the reference voltage may be turned off.

In addition, the first clamping unit and the second clamping unit may output the clamped voltage to the MCU.

In order to solve the above technical problem, a voltage monitoring circuit according to another embodiment of the first embodiment of the present invention is characterized by comprising: a plurality of power input units receiving battery powers; a plurality of switch units connected to each of the plurality of power input units; and a plurality of clamping units connected to each of the plurality of switch units and clamping the voltage of the input power being inputted through the power input unit and the switch unit to a reference voltage, wherein the switch unit is configured as different types of switches, and blocking the input power from the power input unit connected to the clamping unit having an abnormality in the reference voltage among the plurality of power input units.

In order to solve the other technical problem, the over current protection circuit according to an embodiment of the second embodiment of the present invention comprises: a current detection unit for detecting a current being inputted from a power source; a voltage detection unit detecting a first voltage being outputted from the current detection unit, outputting the first voltage to a control unit when the first voltage is less than the second voltage, and outputting the second voltage to the control unit when the first voltage is greater than or equal to the second voltage; and a control unit that determines whether an over current is inputted according to the magnitude of the voltage being inputted from the voltage detection unit In addition, when the second voltage is inputted, the control unit determines that an over current has occurred and may block the power source input from the power source.

In addition, a switch for blocking the power source input from the power source may be included.

In addition, when it is determined that an over current has occurred, the control unit may turn off the switch to block the power source input from the power source.

In addition, the control unit may include a charge pump that transforms a voltage of a control signal to the switch.

In addition, the current detection unit may include a current mirror circuit or a shunt resistor.

In addition, the current detection unit may have a magnitude of a detected current proportional to a magnitude of a voltage being outputted according to the detected current.

In order to solve the other technical problems, an over current protection method according to another embodiment of a second embodiment of the present invention comprises the steps of: detecting a first voltage being outputted from a current detection unit detecting a current applied from a power source; comparing the first voltage and a second voltage; inputting the first voltage to a control unit when the first voltage is less than the second voltage; inputting the second voltage to a control unit when the first voltage is equal to or greater than the second voltage; and determining that an over current has occurred when the second voltage is inputted.

In addition, the method may include a step of blocking a power source input from the power source when it is determined that the over current has occurred.

In addition, the current detection unit may be a current mirror circuit or a shunt resistor.

Advantageous Effects

According to embodiments of the present invention, when an abnormality occurs in the clamping reference voltage of the PMIC, a malfunction may be prevented by blocking the power source to other parts connected to the PMIC. In addition, by implementing the switch as a different device, the possibility of dependent failures that can fail at the same time can be reduced. By receiving the PMIC clamping reference voltage on a separate line, a safety mechanism can be implemented by comparing the battery voltage when one fails.

In addition, damages to parts such as control unit or inverter due to an over current can be prevented.

The effect according to the present invention is not limited by the contents exemplified above, and more various effects are included in this specification.

BRIEF DESCRIPTION OF DRAWINGS

FIGS. 4 to 11(F) are diagrams for explaining the operation of a voltage monitoring circuit according to a first embodiment of the present invention.

FIG. 12 is a block diagram of an over current protection circuit according to an embodiment of a second embodiment of the present invention.

BEST MODE

Hereinafter, preferred embodiments of the present invention will be described in detail with reference to the accompanying drawings.

However, the technical idea of the present invention is not limited to some embodiments to be described, but may be implemented in various forms, and within the scope of the technical idea of the present invention, one or more of the constituent elements may be selectively combined or substituted between embodiments.

In addition, the terms (including technical and scientific terms) used in the embodiments of the present invention, unless explicitly defined and described, can be interpreted as a meaning that can be generally understood by a person skilled in the art, and commonly used terms such as terms defined in the dictionary may be interpreted in consideration of the meaning of the context of the related technology.

In addition, terms used in the present specification are for describing embodiments and are not intended to limit the present invention.

In the present specification, the singular form may include the plural form unless specifically stated in the phrase, and when described as "at least one (or more than one) of A and B and C", it may include one or more of all combinations that can be combined with A, B, and C.

In addition, in describing the components of the embodiment of the present invention, terms such as first, second, A, B, (a), and (b) may be used. These terms are merely intended to distinguish the components from other components, and the terms do not limit the nature, order or sequence of the components.

And, when a component is described as being 'connected', 'coupled' or 'interconnected' to another component, the component is not only directly connected, coupled or interconnected to the other component, but may also include cases of being 'connected', 'coupled', or 'interconnected' due that another component between that other components.

In addition, when described as being formed or arranged in "on (above)" or "below (under)" of each component, "on (above)" or "below (under)" means that it includes not only the case where the two components are directly in contact with, but also the case where one or more other components are formed or arranged between the two components. In addition, when expressed as "on (above)" or "below (under)", the meaning of not only an upward direction but also a downward direction based on one component may be included.

Figure 1:
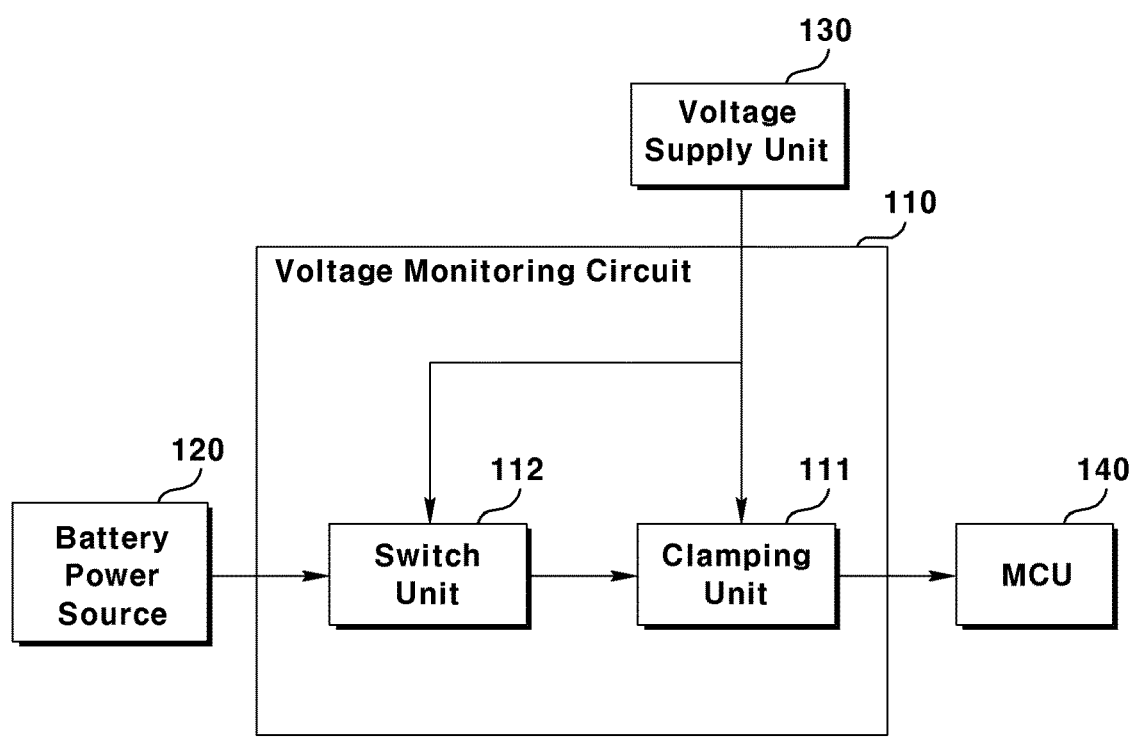
FIG. 1 is a block diagram of a voltage monitoring circuit according to an embodiment of a first embodiment of the present invention.
Figure 2:
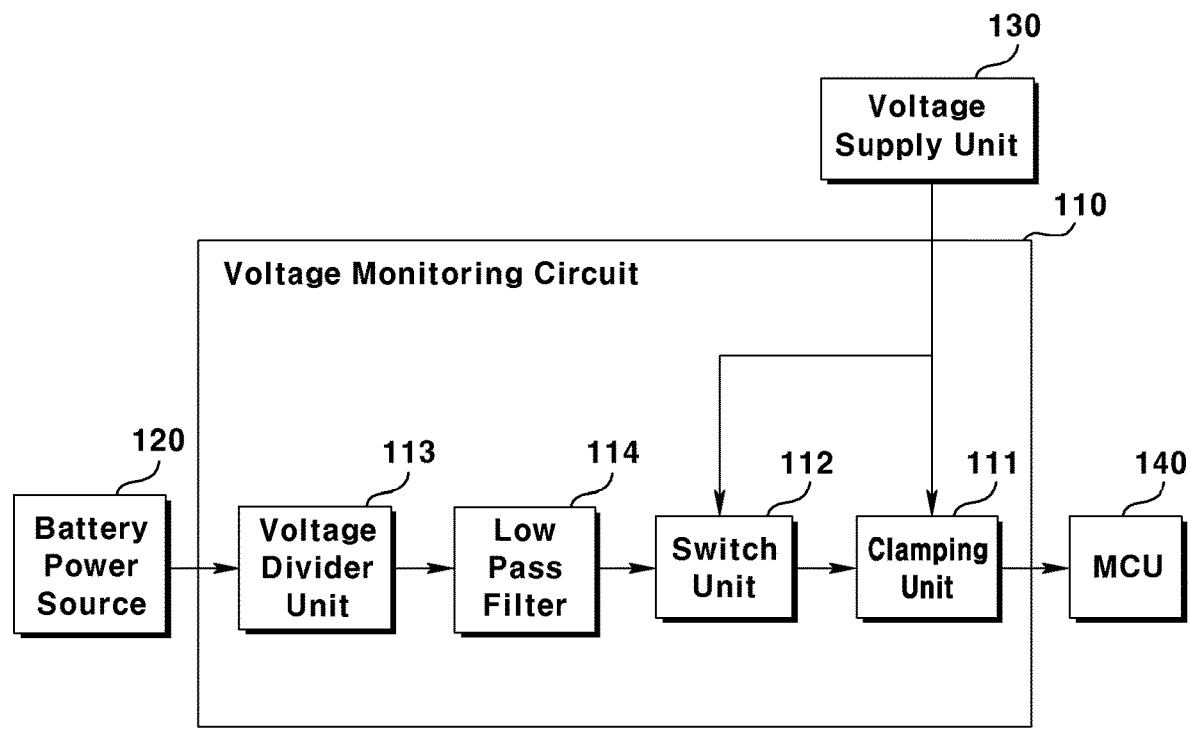
FIGS. 2 and 3 are block diagrams of a voltage monitoring circuit according to another embodiment of a first embodiment of the present invention.

A voltage monitoring circuit 110 according to an embodiment of a first embodiment of the present invention of FIG. 1 comprises a clamping unit 111 and a switch unit 112, and may further include a voltage divider unit 113 and a low pass filter 114.

The clamping unit 111 clamps the voltage of the input power being inputted from the power source 120 to a reference voltage.

More specifically, the clamping unit 111 clamps the voltage level of the input power input to the power source 120 to a reference voltage. Here, clamping refers to fixing the input signal to a certain DC level, and when the magnitude of the voltage of the input power being inputted from the power source 120 is greater than a reference voltage, the magnitude of the voltage of the input power is limited to the reference voltage.

The input power input to the clamping unit 111 may be a battery power 120. Since the voltage of the battery power 120 is not constant, it is necessary to monitor the battery power. To this end, a voltage monitoring circuit 110 for monitoring the voltage level of the battery power 120 is required. The battery power 120 is given as an example, and it is natural that voltage levels of various power 120 other than the battery power 120 can be measured. Hereinafter, it will be described on the basis of receiving the input power from the battery power 120.

The clamping unit 111 may output the clamped voltage to an MCU 140. The voltage clamped to a reference voltage in the clamping unit 111 may be outputted to the MCU 140 for monitoring thereof. A micro controller unit (MCU) 140 receives the clamped voltage from the clamping unit 111 and monitors the voltage of the power source 120. An ADC module of the MCU 140 may receive a voltage of 0 to 5 V to calculate a battery voltage. In this way, an electronic control unit (ECU) can implement a functional safety mechanism by detecting a failure through the monitored battery voltage.

The clamping unit 111 limits the size of the input power inputted from the power source 120 and delivered to the MCU 140 to a reference voltage. This is because, when a voltage greater than a reference voltage is input to the MCU 140, there is a possibility that a circuit or an ADC module in the MCU that detects the voltage may be damaged. Therefore, in order to protect the circuit or module from possible damages, the clamping unit 111 clamps a voltage of the input power to a reference voltage. The clamping unit 111 performs functions as a protection circuit.

The clamping unit 111 may receive a reference voltage having a predetermined voltage level from the voltage supply unit 130. A reference voltage is needed to clamp the voltage of the input power. Based on the reference voltage, the voltage of the input power with a voltage greater than the reference voltage can be lowered to the reference voltage. The reference voltage may vary depending on the voltage to be clamped. The voltage to be clamped may vary depending on safety or device specifications. For example, the reference voltage may be 5 V.

The voltage supply unit 130 supplies a reference voltage for clamping the voltage of the input power in the clamping unit 111. The voltage supply unit 130 may include a power management integrated circuit (PMIC). The reference voltage may be a voltage supplied from the voltage supply unit 130 to other components. That is, the voltage provided to other components can be supplied as a reference voltage for clamping.

The switch unit 112 blocks the input power from the power source 120 when an abnormality occurs in the reference voltage of the clamping unit 111.

More specifically, the switch unit 112 blocks the input power so that the input power is not being inputted when an abnormality occurs in the reference voltage of the clamping unit 111. As previously described, a reference voltage of the clamping unit 111 may be supplied from the voltage supply unit 130, but when an abnormality such as a failure occurs in a connection line or the voltage supply unit 130 being supplied with a reference voltage from the voltage supply unit 130, it becomes difficult for the clamping unit 111 to receive a reference voltage stably from the voltage supply unit 130. When a reference voltage is not being supplied stably, an abnormality may also occur in clamping the voltage of the input power. Accordingly, a malfunction may occur as the voltage monitoring circuit may not operate normally. To prevent malfunction of the voltage monitoring circuit or other circuits or devices connected to the voltage monitoring circuit, when an abnormality occurs in the reference voltage, the switch unit 112 blocks the input power from the power source 120. By blocking the input power, it is possible to prevent malfunctions that may occur from an unclamped input power.

The switch unit 112 may block the input power from the power source 120 to block the application of the power to the voltage supply unit 130. When the clamping unit 111 receives a reference voltage from the voltage supply unit 130 and an abnormality occurs in the reference voltage, and if a reference voltage is not being supplied normally, the input power inputted to the clamping unit 111 may affect the voltage supply unit 130 side through the clamping unit 111. The voltage supply unit 130 not only supplies a reference voltage to the clamping unit 111 but also may supply a voltage corresponding to a reference voltage to other components. When the voltage supply unit 130 includes a PMIC, it may supply voltage to other components such as a CAN IC performing CAN communication and a sensor, and when the voltage supply unit 130 does not supply voltage normally, the input power may be applied to the voltage supply unit 130 side through the clamping unit 111 to affect other components connected to the voltage supply unit 130. When the voltage of the input power is greater than the voltage that has been supplied by the voltage supply unit 130, an over voltage may be applied to other components and a failure may occur. When the input power is a battery power, the voltage value of the battery power may fluctuate rather than a constant voltage, and accordingly, when the voltage value of the input power fluctuates, other components are also affected. When the corresponding component is a component that performs communication, and the like, an error may occur in communication, which may cause a major safety problem.

For example, if it affects the CAN IC, normal CAN communication may not be performed. CAN communication is a communication method used in automobiles and the like, and represents a value of 0 or 1 depending on 0 V or 5 V. In a situation where 5 V has been supplied from the voltage supply unit 130 to transmit 5 V representing 1, a voltage other than 5 V or a voltage whose voltage value fluctuates is inputted by an input power other than the voltage supply unit 130, the corresponding voltage may be determined to be 0 instead of 1, and normal communication may become difficult. In addition, when an abnormality occurs in the voltage of 5 V that has been supplied to the voltage supply unit 130, such as a pressure sensor or a temperature sensor, accurate sensing may become difficult, and other operations according to sensing information may malfunction.

In order to prevent malfunction of other components as described above, when an abnormality occurs in a reference voltage, the switch unit 112 blocks the input power from the power source 120.

The voltage divider unit 113 may be connected to the front end of the clamping unit 111 to divide the voltage of the input power. The voltage divider unit 113 may divide the input voltage so that a constant voltage is outputted. The low-pass filter 114 may be connected to the front end of the clamping unit 111 to filter the input power. The low-pass filter 114 may remove noise from the input power so that a stable voltage is outputted. The voltage divider unit 113 and the low-pass filter 114 may be connected to the front end of the clamping unit 111 in order, and it may serve to deliver a stable input power to the clamping unit 111.

The switch unit 112 may be configured as a transistor or a MOSFET.

A transistor is a semiconductor device used to amplify or switch electronic signals and power using semiconductors such as germanium (Ge) and silicon (Si), and is consisted of a collector, an emitter, and a base. It is divided into NPN or PNP transistors according to the characteristics of the semiconductor forming each configuration. When a forward voltage is applied between the emitter and the base, a current flows in the collector, and using this principle of operation, it can be used as a switch.

The MOSFET is a metal oxide semiconductor field effect transistor and is consisted of a source, a drain, and a gate. According to the characteristics of the semiconductor device used, it is divided into NMOS or PMOS. When a voltage is applied to the gate, a channel is formed between the source and the drain so that current flows through the channel that has been formed, and thus it can be used as a switch using this operating principle.

Figure 3:
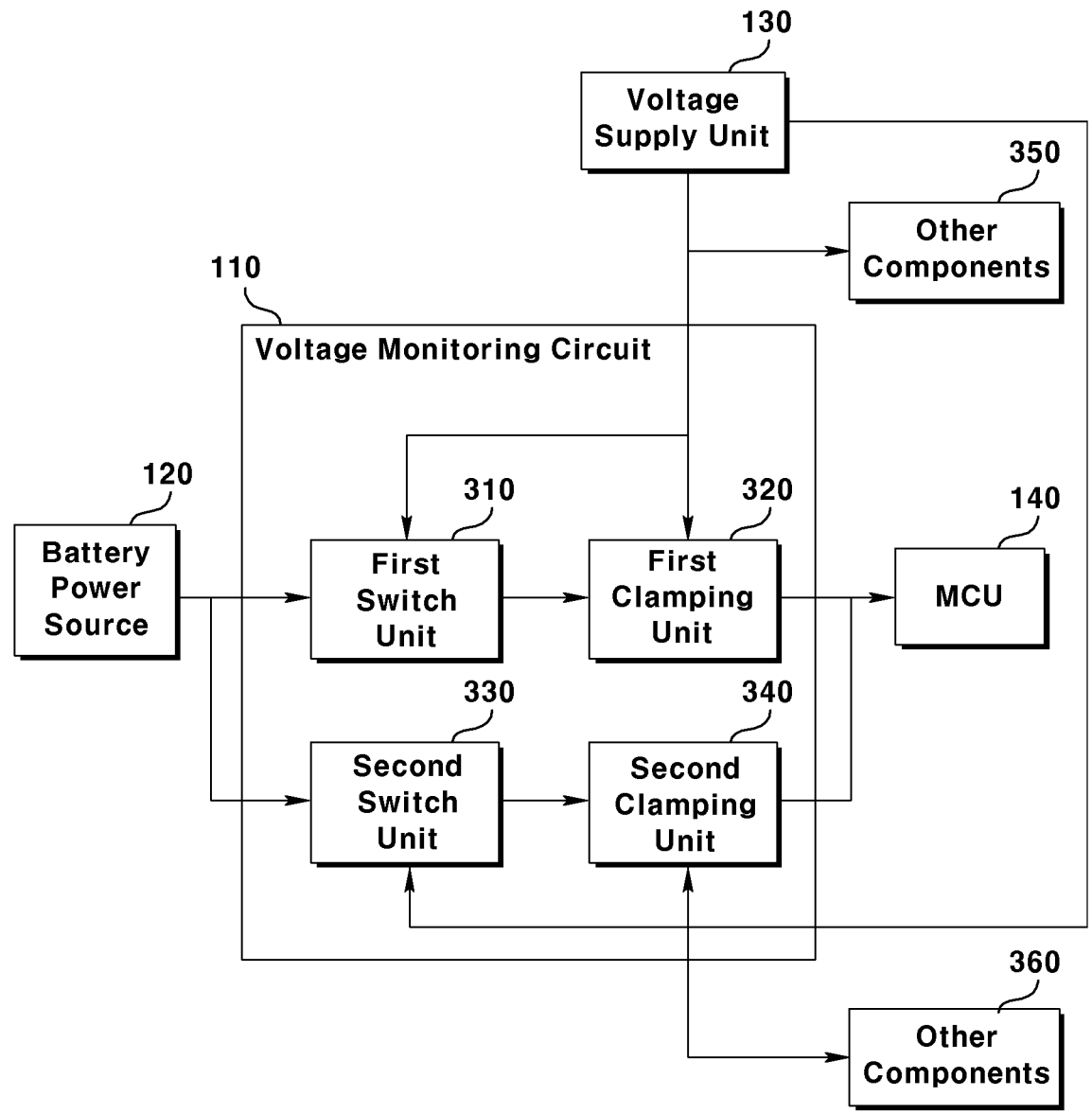

The voltage monitoring circuit 110 according to another embodiment of a first embodiment of the present invention may be consisted of a plurality of movement paths of the input power formed by the switch unit and the clamping unit. As shown in FIG. 3, the voltage monitoring circuit 110 according to another embodiment of a first embodiment of the present invention may be consisted of a first power input unit, a second power input unit (not shown), a first switch unit 310, a second switch unit 330, a first clamping unit 320, a second clamping unit 340. A description corresponding to the detailed description of the voltage monitoring circuit of FIG. 1 among the detailed description of the voltage monitoring circuit of FIG. 3 will be briefly described.

The first power input unit and the second power input unit receive a battery power.

More specifically, the first power input unit and the second power input unit may receive the battery power 120 for which voltage is to be monitored, respectively. By receiving the battery power 120 as input from two power input units and transferring it to the MCU 140, even if an abnormality occurs in one transfer path, the voltage of the battery power 120 is transferred to the MCU 140 through another transfer path to enable stable voltage monitoring. The first switch unit 310 is connected to the first power input unit, and the second switch unit 330 is connected to the second power input unit.

The first clamping unit 320 clamps the voltage of the input power being inputted through the first power input unit and the first switch unit 310 to a reference voltage, and the second clamping unit 340 clamps the voltage of the input power being inputted through the second power input unit and the second switch unit 330 to a reference voltage. The first clamping unit 320 and the second clamping unit 340 respectively clamp the input voltage of the input power to a reference voltage. The reference voltage of the first clamping unit 320 and the reference voltage of the second clamping unit 340 may have the same voltage value. Or, the reference voltage of the first clamping unit 320 and the reference voltage of the second clamping unit 340 may have different voltage values.

The first clamping unit 320 and the second clamping unit 340 may receive a reference voltage having a predetermined voltage level from the voltage supply unit 130 through a separate connection line. The first clamping unit 320 and the second clamping unit 340 may receive a reference voltage from one voltage supply unit 130. When the voltage supply unit 130 includes a plurality of output lines, the first clamping unit 320 and the second clamping unit 340 may receive a reference voltage through separate connection lines at different output lines. When an abnormality occurs in any one of the connection line with the voltage supply unit 130 of the first clamping unit 320 or the connection line with the voltage supply unit 130 of the second clamping unit 340, the connection line in which the abnormality does not occur may be operated normally to stably operate the voltage monitoring of the battery power 120. The first clamping unit 320 and the second clamping unit 340 may each receive a reference voltage from a plurality of voltage supply units 130 instead of one voltage supply unit 130.

The first clamping unit 320 and the second clamping unit 340 may clamp each input power using a reference voltage and output the clamped voltage to an MCU 140. The MCU 140 may know the voltage of the battery power 120 through the voltage being transferred from the first clamping unit 320 or the voltage being transferred from the second clamping unit 340.

The first switch unit 310 blocks the input power from the first power input unit when an abnormality occurs in a reference voltage of the first clamping unit 320, and the second switch unit 330 blocks the input power from the second power input unit when an abnormality occurs in a reference voltage of the second clamping unit 340. When an abnormality occurs in a reference voltage of the first clamping unit 320 and the second clamping unit connected to the first switch unit 310 and the second switch unit 330, respectively, the input power of the power input unit connected to the clamping unit that has an abnormality in the reference voltage is blocked.

In operating the first switch unit 310 or the second switch unit 330, by comparing the voltage clamped by the first clamping unit 320 with the voltage clamped by the second clamping unit 340, it is determined whether an abnormality occurs in the reference voltage of the first clamping unit 320 or the reference voltage of the second clamping unit 340, and if an abnormality occurs in the reference voltage of the first clamping unit 320 or the reference voltage of the second clamping unit 340, the first switch unit 310 or the second switch unit 330 connected to the clamping unit having an abnormality in the reference voltage can be turned off. As such, whether the reference voltage is abnormal can be determined by comparing the voltage clamped by the first clamping unit 320 with the voltage clamped by the second clamping unit 340. The comparison of the voltage clamped by the first clamping unit 320 and the voltage clamped by the second clamping unit 340 may be performed in the MCU 140 or may be performed in a separate processing unit or control unit.

The voltages respectively clamped by the first clamping unit 320 and the second clamping unit 340 have the same voltage value when the voltage monitoring circuit operates normally. However, when the voltage clamped in the first clamping unit 320 and the clamping voltage in the second clamping unit 340 have different voltages, it may be determined that an abnormality has occurred in the voltage monitoring circuit. For example, when one of the two voltages suddenly decreases or increases, it may be determined that an abnormality has occurred in a clamping unit, a voltage supply unit, or a voltage supply unit that clamps the corresponding voltage and a connection line. Alternatively, when both voltages become greater than the reference voltage, it may be determined that an abnormality has occurred in both paths of the voltage monitoring circuit.

When it is determined that an abnormality has occurred in at least one of the first clamping unit 320 and the second clamping unit 340, it is possible to block the input power by turning off the switch unit connected to the clamping unit 111 that is determined to have an abnormality. When an abnormality is found in both clamping units 111, it is possible to block the input power by turning off all the switch units.

The first switch unit 310 and the second switch unit 330 may be configured with different elements. For example, the first switch unit 310 is configured with a transistor, and the second switch unit 330 is configured with a MOSFET; and the first switch unit 310 is configured with a MOSFET, and the second switch unit 330 may be configured with a transistor. As described above, using a circuit forming two paths is for normal operation through another circuit when an abnormality occurs in one circuit; and it is intended to operate another switch unit normally when an abnormality occurs in one switch unit among the switch units. At this time, it is possible to prevent dependent failure by using different type elements. When the first switch unit 310 and the second switch unit 330 are configured with different elements, the probability of occurrence of a failure is different, accordingly, even if a failure occurs in one element, the probability that the same failure occurs in another element may be reduced. To this end, the first switch unit 310 and the second switch unit 330 may be configured with different elements among transistors and MOSFETs.

Another voltage monitoring circuit of a first embodiment of the present invention may include a plurality of power input units, a plurality of switch units, and a plurality of clamping units. Voltage monitoring paths, each of which is consisted of each power input unit, switch unit, and clamping unit are formed are formed in plural, and each switch unit 112 is configured with a different type of switch, and may block an input power from a power input unit connected to a clamping unit having an abnormality in a reference voltage among the plurality of power input units. At this time, each of the power input unit, switch unit, and clamping unit may be consisted of 3 or more.

Figure 4:
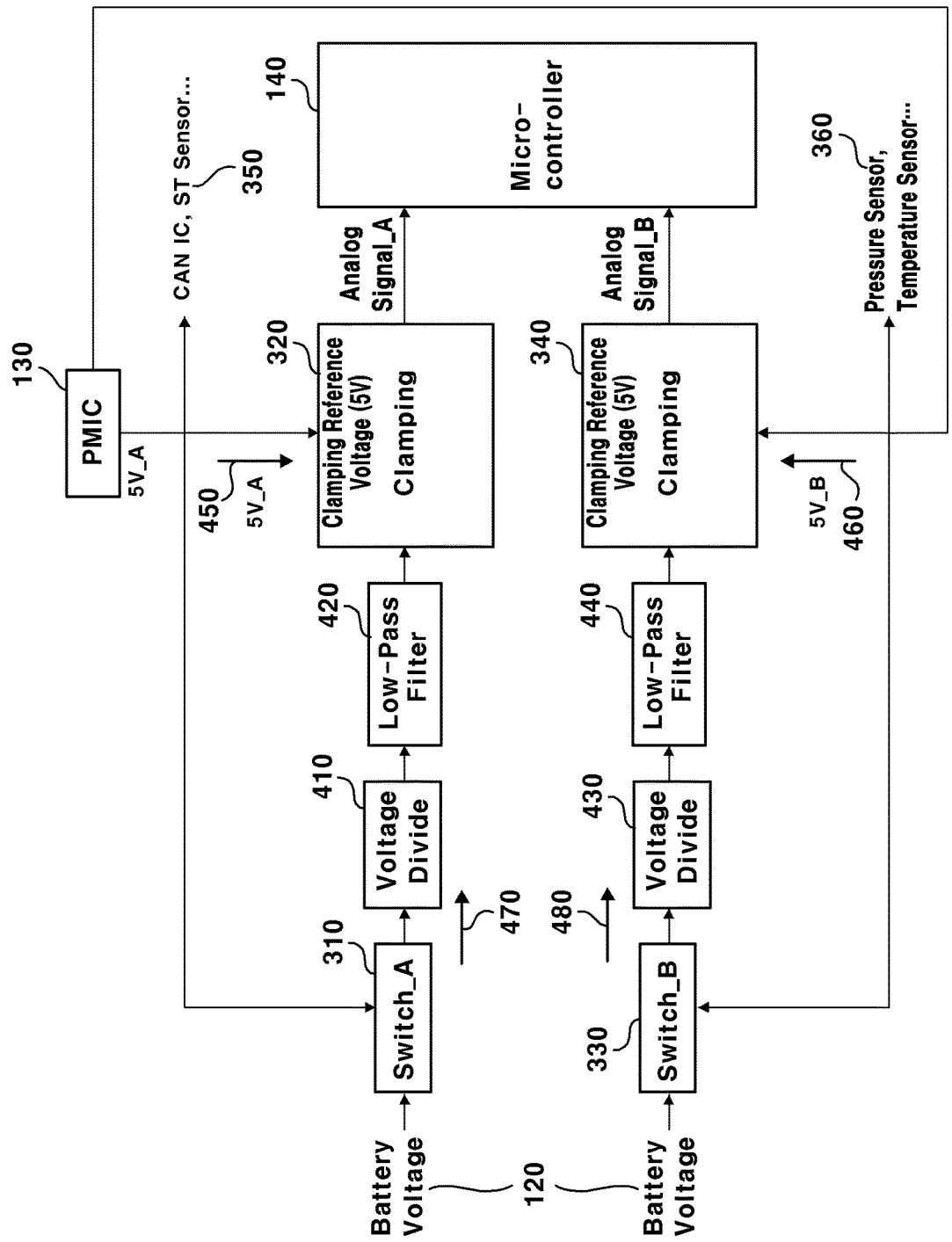

FIG. 4 is a block diagram of a circuit for monitoring battery voltage, illustrating a case in which the battery voltage is monitored with an enhanced stability through two paths. In the voltage monitoring circuit of FIG. 4, a voltage monitoring path formed of a switch, a voltage divider unit, a low pass filter, and a clamping unit consists of two paths. The battery voltage 120 is separated and transferred through the paths of: a path applied to the microcontroller 140 through the switch_A 310, the voltage divider unit 410, the low pass filter 420, and the clamping unit 320; and a path applied to the microcontroller 140 through the switch_B 330, the voltage divider unit 430, the low pass filter 440, and the clamping unit 340. The two clamping units 320 and 340 receive a reference voltage of 5 V from the PMIC 130 through different connection lines. The PMIC 140 is connected to the CAN IC 350 and the sensor 360 as well as the clamping units 320 and 340.

In a situation in which the voltage monitoring circuit operates normally, each of the clamping unit 320 and 340 normally receives 5V_A 450 and 5V_B 460 from the PMIC 130, respectively, and each of the switch units 310 and 330 is also turned on normally so that the battery voltage 120 is normally transmitted (470, 480) to each clamping unit 320 and 340.

Figure 5:
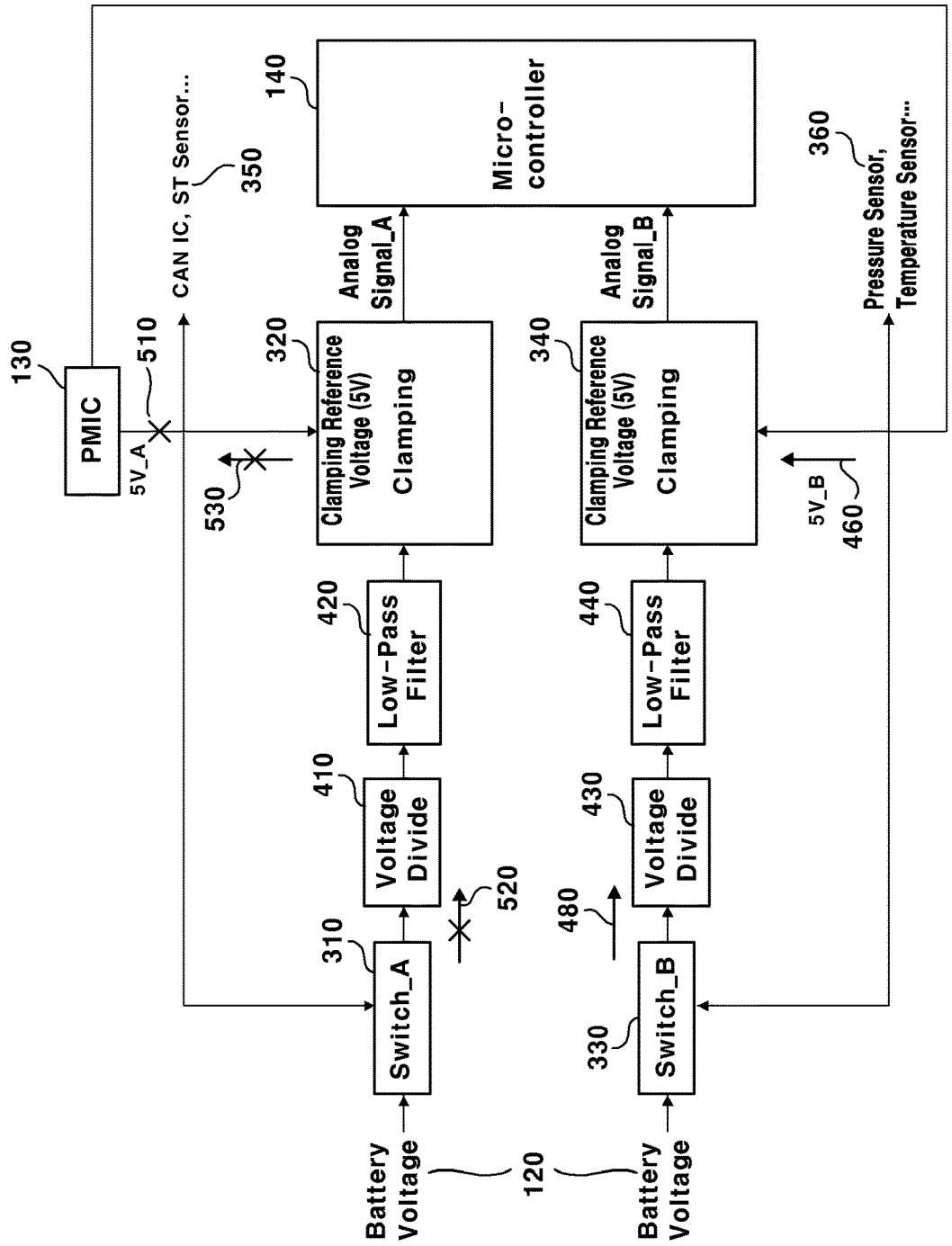

However, when an abnormality occurs in a reference voltage, the switch unit operates to prevent malfunction. FIG. 5 is a diagram for explaining the operation of the voltage monitoring circuit when an abnormality occurs in a connection line for applying a reference voltage to the clamping unit 320 in the PMIC 130. At this time, it is assumed that no abnormality occurs in the connection line for applying a reference voltage to the clamping unit 340 in the PMIC 130. When an abnormality occurs in the connection line 510 that applies the reference voltage 5V_A from the PMIC 130 to the clamping unit 320, the battery voltage may be applied (530) to the PMIC 130, not the microcontroller 140, through the clamping unit 111, and thus may affect other components connected to the corresponding connection line 510 to cause a malfunction. Accordingly, when an abnormality occurs in the connection line 510, the abnormality of the corresponding connection line 510 is determined and the connected switch unit 310 is turned off to block the input of the battery voltage. As such, by blocking the input of the battery voltage, the battery voltage being transferred to the clamping unit 320 does not exist, and accordingly, the voltage applied from the clamping unit 320 to the PMIC 130 can be blocked (530). Through this, it is possible to prevent malfunction of other components connected to the corresponding connection line 510.

Unlike the switch_A 310 connected to the clamping unit 320 in which the abnormality occurred in the reference voltage is turned off to block the input of the battery voltage, the switch_B 330 connected to the clamping unit 330 in which the abnormality in the reference voltage does not occur normally maintains on, so that the input of the battery voltage is not blocked. 5V_B is normally applied from the PMIC 130 to the clamping unit 340 to normally clamp the battery voltage in the clamping unit 340, and the clamped voltage is applied to the microcontroller 140. The microcontroller 140 may monitor the battery voltage using the analog signal_B received through the clamping unit 340 and implement a functional safety mechanism through comparison with the analog signal_A. Through this, the detection of the normal range of the battery voltage can be increased to about 90%.

Figure 6:
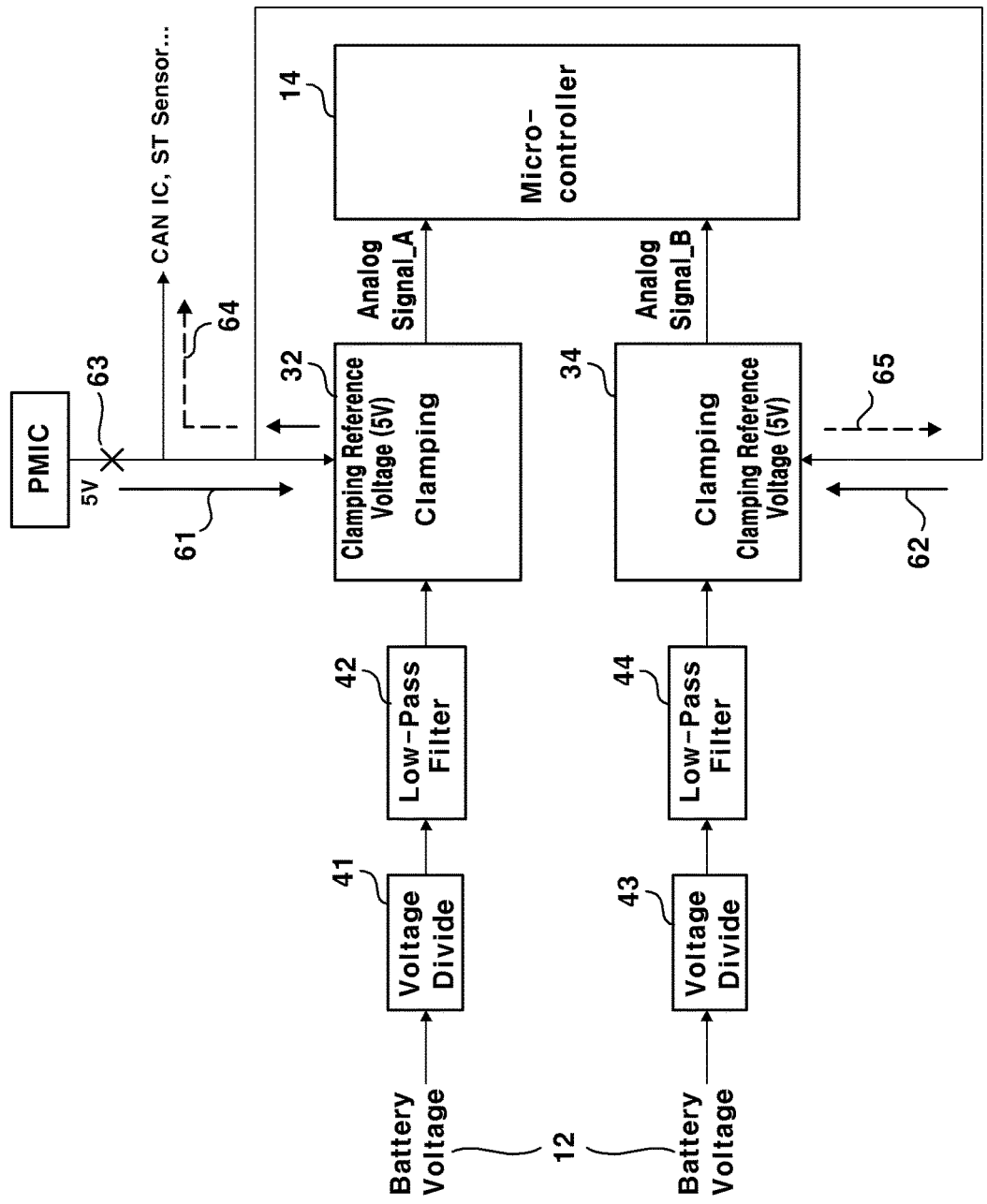
Figure 7:
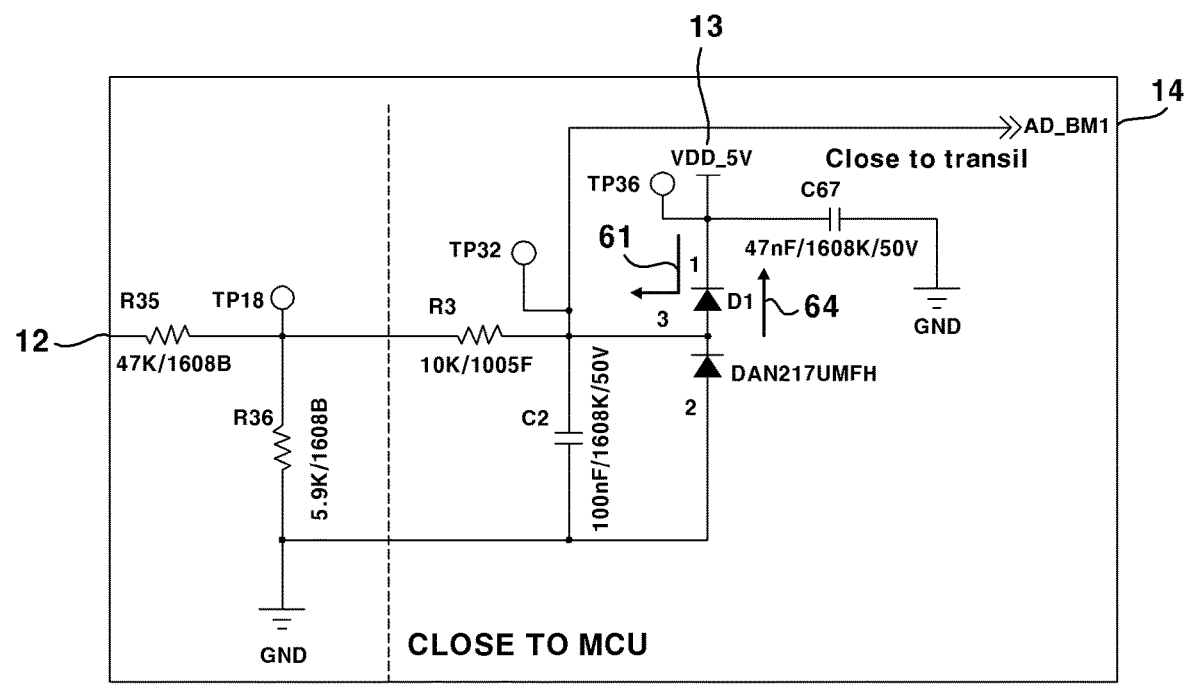

Unlike the voltage monitoring circuit of FIGS. 4 and 5, when a reference voltage is supplied from the PMIC to each clamping unit 32, 34 through one connection line 63 without including a switch unit as shown in FIG. 6, a malfunction occurs may be difficult to prevent. The voltage monitoring circuit of FIG. 6 may be implemented as shown in FIG. 7. The clamping unit may be implemented as a diode, as shown in FIG. 7.

The voltage monitoring circuit according to FIGS. 6 and 7 may apply the battery voltage 12 to the microcontroller 14 through a path consisting of: a voltage divider unit 41, a low pass filter 42, and a clamping unit 32; and a path consisting of a voltage divider unit 43, a low pass filter 44, and a clamping unit 34. In case of normal operation, 5 V (13) from the PMIC can be normally applied (61, 62) to each clamping unit. However, if an abnormality occurs on the PMIC side, the battery voltage is applied to the PMIC side through the clamping unit 32 and 33, thereby affecting other components such as the CAN IC or sensor connected to the PMIC 64, which may cause a malfunction. In addition, since only one connection line in the PMIC receives the reference voltage, the voltage monitoring circuit does not operate at the same time, so the functional safety mechanism coverage is low. In this case, the detection of the normal range of the battery voltage may be only about 60%.

Figure 8:
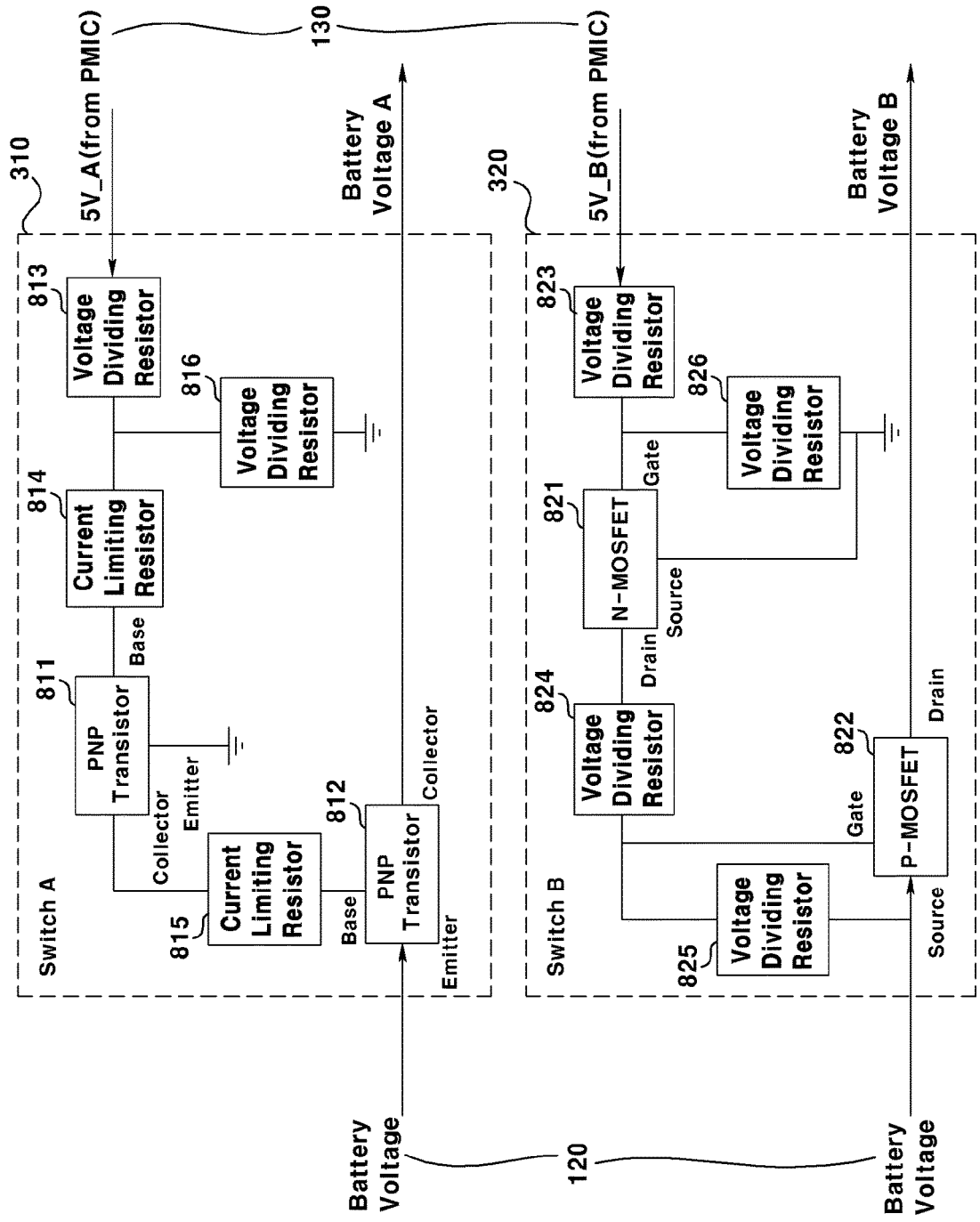

As described above, in order to prevent a malfunction, the switch included in the voltage monitoring circuit may be consisted of different elements, and may each be composed of one of a transistor and a MOSFET. FIG. 8 is a block diagram of an embodiment in which the first switch unit 310 is configured as a transistor and the second switch unit 330 is configured as a MOSFET.

The first switch unit 310 is configured as a transistor, and may be configured as a PNP transistor. It may include a plurality of PNP transistors, a current limiting resistor, and a voltage dividing resistor. The transistor 812 may be connected to a line that transfers the battery voltage 120 to the clamping unit. At this time, the emitter may be connected to the battery voltage 120, the collector may be connected to the clamping unit side, and the base may be connected to the voltage supply side. Here, the voltage supply unit may be a PMIC. Current flows to the collector according to the voltage on the PMIC side applied to the base, and when an abnormality occurs in the voltage on the PMIC side corresponding to the reference voltage and no voltage is applied to the base, current does not flow to the collector, thereby blocking the input of the battery voltage. This prevents malfunction of the voltage monitoring circuit or other connected components. The circuit connecting the transistor 812 performing a switching operation in the PMIC includes two voltage dividing resistors 831 and 816 for dividing the PMIC voltage, and further includes a transistor 811 capable of applying 0 V to the base of the transistor 812 according to the inputting of the voltage of PMIC voltage has been divided, and may further include current limiting resistors 814 and 815 for preventing an abnormal flow of current. Through this, it is possible to perform a stable switching operation.

In order to prevent a dependent failure, unlike the first switch unit 310, the second switch unit 330 may be configured as a MOSFET. It may include a P-MOSFET, an N-MOSFET, and a plurality of voltage dividing resistors. The PMOS 822 may be connected to a line that transfers the battery voltage 120 to the clamping unit. At this time, the source may be connected to the battery voltage 120, the drain may be connected to the clamping unit side, and the gate may be connected to the PMIC side. A channel is formed between the source and the drain according to the voltage on the PMIC side applied to the gate, and when an abnormality occurs in the voltage on the PMIC side corresponding to the reference voltage and no voltage is applied to the base, since a channel is not formed between the source and the drain, the input of the battery voltage is blocked. This prevents malfunction of the voltage monitoring circuit or other connected components.

Figure 9:
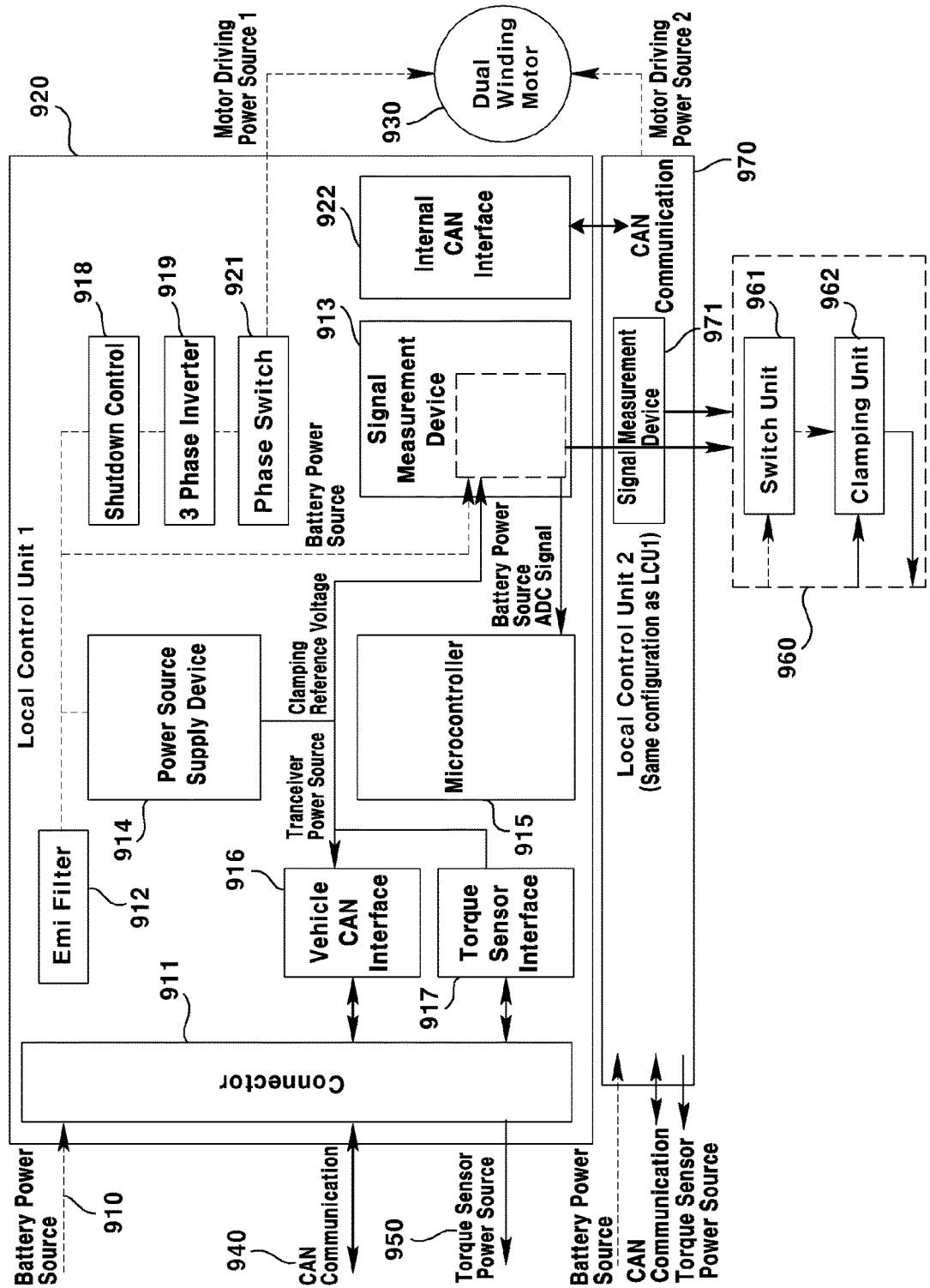

As described above, the operating voltage monitoring circuit may be used inside the LCU for driving the motor using the battery power of FIG. 9. The battery power 910 is applied to the dual motor 930 using two LCUs 920 and 970, and each LCU transmits and receives a battery power 910, CAN communication 940, and a torque sensor power 950 through the connector 911. The battery power 910 is applied to the power supply device 914, the signal measurement device 913, and the shutdown control 918 through the EMI filter 912. The power applied to the shutdown control 918 is applied to the dual motor 930 as a motor driving power 1 through the three-phase inverter 919 and the phase switch 921. The battery power applied to the signal measurement device 913 is applied to the microcontroller 915 through the voltage monitoring circuit 960. The voltage monitoring circuit 960 includes a switch unit 961 and a clamping unit 962, and may be implemented as a circuit as shown in FIG. 4. The battery power applied to the power supply device is applied as a clamping reference voltage to the signal measuring device 913, and it is applied to the vehicle CAN interface 916 and the torque sensor interface 915 as a transceiver power to be transmitted to the CAN communication 940 and the torque sensor power 950 through the connector 911. The LCU 970 has the same configuration as the LUC 920, and may perform CAN communication with each other through the internal CAN interface 922. A voltage monitoring circuit 960 may be included in the signal measuring device of the LCU 970 to correspond to it.

Figure 10A:
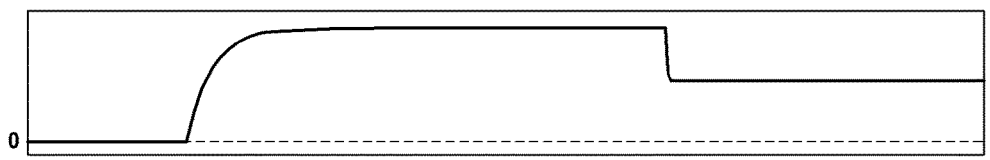
Figure 10B:
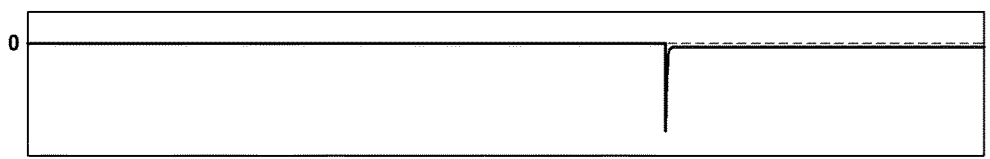
Figure 10C:
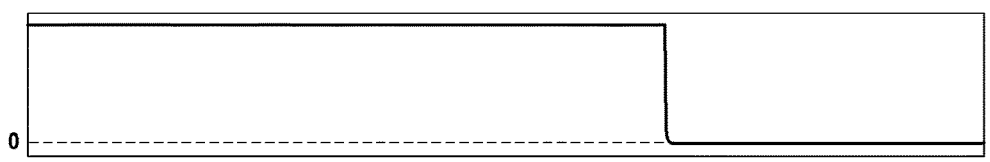
Figure 13:
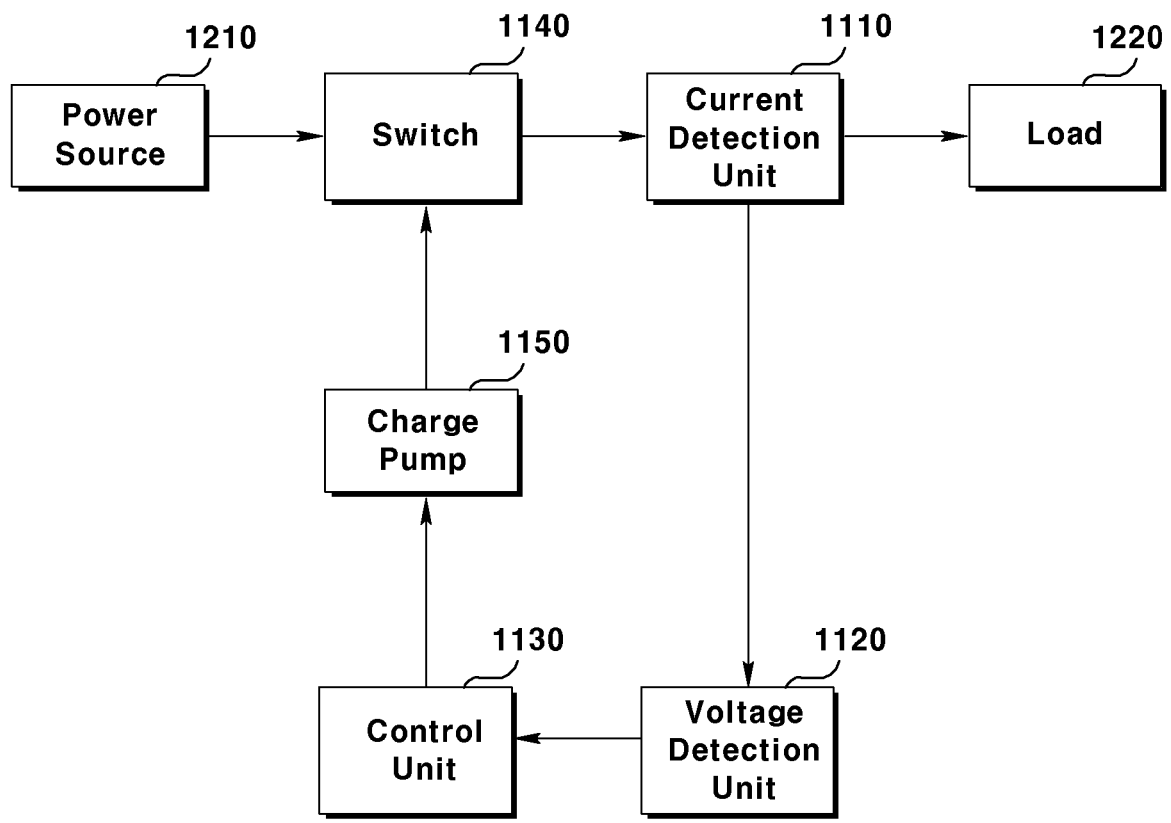
FIG. 13 is a block diagram of an over current protection circuit according to another embodiment of a second embodiment of the present invention.

FIG. 10 shows waveforms of voltages and currents measured in the voltage monitoring circuit of FIGS. 6 and 7; FIG. 10(A) is an ADC signal of battery voltage, FIG. 10(B) is a current flowing from the clamping unit to the PMIC, and FIG. 10(C) is a clamping reference voltage supplied from the PMIC.

As shown in FIG. 10(C), when a stable clamping reference voltage of 5 V is applied, as shown in FIG. 10(A), it can be seen that the battery operates normally when the battery power is applied. However, when an abnormality occurs in the clamping reference voltage and it drops to 0 V, as shown in FIG. 10(B), the analog potential for measuring the battery voltage is high and a current flows from the clamping circuit to the PMIC power. As the battery voltage is applied to the PMIC side, it can be seen that the ADC signal of the battery voltage is reduced as shown in FIG. 10(A). In section 1001 on the horizontal axis, which is the time axis, normal ADC supply is possible after inputting the battery power, but when an abnormality occurs in the clamping circuit, the battery voltage ADC becomes abnormal as shown in FIG. 10(A) in section 1002, and when the power of the PMIC is turned off, as shown in FIG. 10(B), the power is supplied to other components through the clamping diode, which may cause a malfunction.

FIG. 11 illustrates waveforms of voltage and current being measured in the voltage monitoring circuit of FIGS. 4 and 5 including two switches A and B. FIGS. 11(A) to (C) are waveforms for the switch A side, respectively, indicating the battery voltage ADC signal, the current flowing from the clamping unit to the PMIC, and the clamping reference voltage supplied from the PMIC. FIGS. 11(D) to (F) are waveforms for switch B side and respectively indicating the battery voltage ADC signal, current flowing from the clamping unit to the PMIC, and clamping reference voltage supplied by PMIC. It can be seen that: in section 1101 on the horizontal axis, which is the time axis, normal ADC supply is possible after inputting the battery power; according to the operation of switches A and B in section 1102 where an abnormality occurs in the clamping circuit, as shown in FIGS. 11(A) and (C), the battery power ADC becomes 0 V, and as shown in FIGS. 11(B) and (E), the current flowing from the clamping circuit to the PMIC also becomes 0 A.

As described above, the voltage monitoring circuit according to a first embodiment of the present invention has been described with reference to FIGS. 1 to 11. Hereinafter, an over current protection circuit and an over current protection method according to a second embodiment of the present invention will be described with reference to FIGS. 12 to 19. The detailed description of the over current protection circuit and the over current protection method according to a second embodiment of the present invention is based on the voltage monitoring circuit and the names, terms, and functions according to the first embodiment of the present invention, and the detailed descriptions of each embodiment, may be the same as or different from each other.

Hereinafter, the configuration of an over current protection circuit and an over current protection method according to a second embodiment of the present invention will be described with reference to the drawings.

FIG. 12 is a block diagram of an over current protection circuit according to an embodiment of a second embodiment of the present invention.

An over current protection circuit 1000 according to an embodiment of the second embodiment of the present invention is configured as a current detection unit 1110, a voltage detection unit 1120, and a control unit 1130, and a switch 1140 or a charge pump 1150 may be further included.

The current detection unit 1110 detects a current being inputted from the power source 1210.

More specifically, the current detection unit 1110 detects a current being inputted from the power source 1210 in order to monitor the current being inputted from the power source 1210. The current detection unit 1110 is positioned in the input line of the power source 1210 before the input power is applied to the load 1220 to detect the current.

The current detection unit 1110 may include a current mirror circuit or a shunt resistor. A current mirror circuit is a circuit that copies and supplies the same current as the current flowing in one circuit to another circuit like a mirror.

Figure 14:
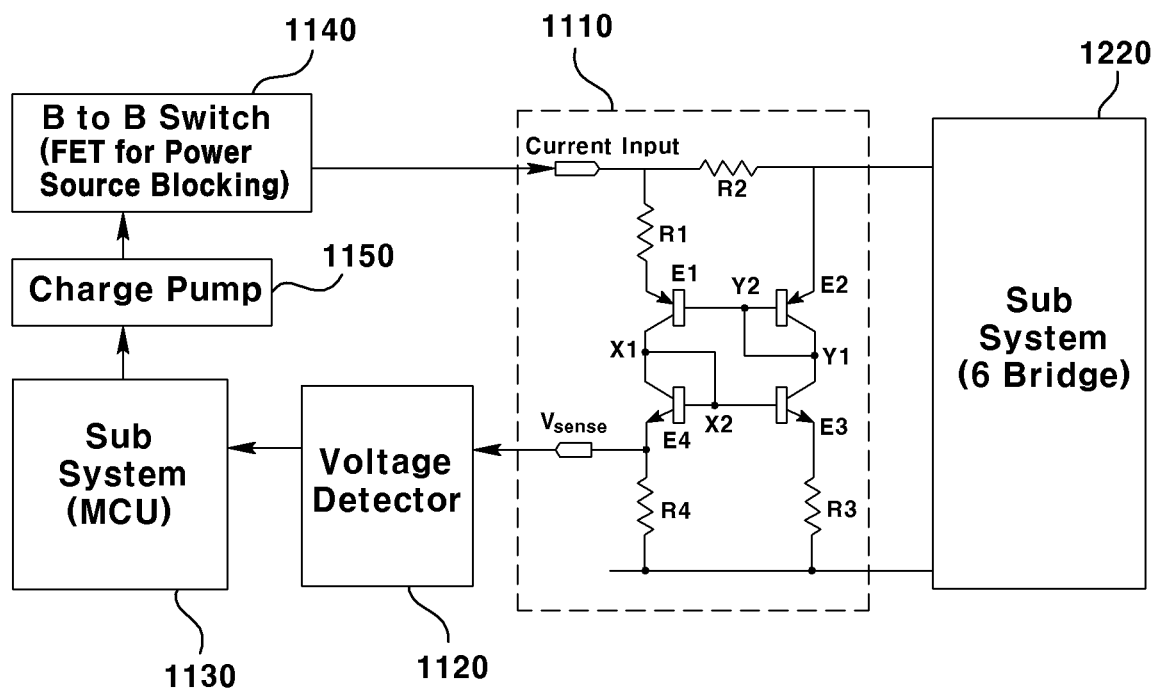
FIG. 14 is a diagram for explaining the operation of an over current protection circuit according to a second embodiment of the present invention.

The current mirror circuit may be implemented as shown in FIG. 14. The current mirror circuit will be described in detail later.

A shunt resistor is a type of shunt resistor and is a resistor used to measure current and has a very low resistance value. A shunt resistor is also called a shunt. The shunt resistor is connected in series to the position where the current is to be measured, and the voltage generated in the shunt resistor is measured, and the current is measured using the equation 'current=voltage/resistance'.

In addition, various circuits or devices for sensing current may be used as a current detection unit 1110.

In the current detection unit 1110, the magnitude of a detected current and a magnitude of a voltage being outputted according to the sensed current may be proportional. The current detection unit 1110 measures the current, and may output a voltage as a result, and the magnitude of the detected current and the magnitude of the voltage being outputted according to the detected current may be proportional to each other. For example, when the current detection unit 1110 is formed such that 1 V is outputted when 10 A flows, 10 V can be outputted when 100 A flows. As described above, the current may be measured using the voltage outputted from the current detection unit 1110 using a relationship in which the magnitude of the current detected by the current detection unit 1110 is proportional to the magnitude of the outputted voltage.

The voltage detection unit 1120 detects the first voltage being outputted from the current detection unit 1110, and outputs the first voltage to the control unit when the first voltage is less than the second voltage, and when the first voltage is equal to or greater than the second voltage, the second voltage is outputted to the control unit.

More specifically, the voltage detection unit 1120 may detect the first voltage being outputted from the current detection unit 1110, but may output a different voltage to the control unit according to the magnitude of the first voltage. As described above, the current detection unit 1110 measures the current and outputs a voltage. The voltage being outputted is applied to the control unit 1130 to measure a current from the voltage applied from the control unit 1130. Suppose that the voltage being outputted from the current detection unit 1110 is a first voltage, and when the first voltage is directly applied to the control unit 1130, and when the magnitude of the first voltage is greater than the magnitude of the voltage that the control unit 1130 can withstand due to over current, and the like, damage may occur to the control unit 1130. Accordingly, in order to protect the control unit 1130, the voltage detection unit 1120 does not directly apply the first voltage to the control unit 1130, but the voltage applied to the control unit 1130 may be limited according to the level of the first voltage.

The voltage detection unit 1120 outputs the first voltage to the control unit 1130 when the first voltage is less than the second voltage, and when the first voltage is equal to or greater than the second voltage, the second voltage is outputted to the control unit 1130. That is, when the first voltage is less than the second voltage being set from the voltage that may cause damage to the control unit 1130, since the first voltage has a level that does not damage the control unit 1130, the voltage detection unit 1120 outputs the first voltage to the control unit 1130.

However, when the first voltage is equal to or greater than the second voltage, damage to the control unit 1130 may occur when the first voltage is applied to the control unit 1130 as it is. A second voltage that does not cause damage to the control unit 1130 other than the first voltage is outputted to the control unit 1130. That is, the voltage detection unit 1120 conditionally clamps the first voltage to the second voltage.

For example, when a second voltage is 5 V, if a first voltage is 2 V, which is less than 5 V, a first voltage of 2 V is outputted to the control unit 1130. However, when a first voltage is 6 V which is a second voltage that is 5 V or more, 5 V which is a second voltage, not 6 V which is a first voltage, is outputted to the control unit 1130.

The second voltage may be a limit voltage of the control unit 1130 or a voltage smaller than the limit voltage by a margin value. The limit voltage of the input/output terminal of the control unit 1130 may be used. For example, when the limit voltage of the control unit 1130 is 6 V, the second voltage may be set to 5 V by applying a margin of 1 V. When a wider margin is applied, the safety can be improved more, but since the range of allowable current may be reduced, the second voltage must be set appropriately. The second voltage may be set by a user.

The voltage detection unit 1120 may be implemented as a voltage detector IC. The voltage detector IC is an IC that limits the magnitude of a sensed voltage to a predetermined magnitude or less, and can limit the magnitude of the voltage being outputted to the control unit 1130 by using this.

The control unit 1130 determines whether over current is inputted according to the magnitude of the voltage being inputted from the voltage detection unit 1120.

More specifically, the control unit 1130 measures the magnitude of the current being detected by the current detection unit 1110 using the voltage being inputted from the voltage detection unit 1120, and determines whether over current is inputted according to the magnitude of the measured current.

As previously described, the current detection unit 1110 detects a current and outputs a voltage, and the magnitude of the current and the magnitude of the voltage are proportional to each other. The control unit 1130 may measure the magnitude of the current from the magnitude of the voltage being inputted from the voltage detection unit 1120. When the current detection unit 1110 is a current mirror circuit, the current may be measured from the voltage using the relationship between the current and the voltage according to the characteristics of the current mirror circuit. When the current detection unit 1110 is a shunt resistor, the current may be measured from the voltage and the shunt resistor according to the relationship between the voltage and the resistance. Alternatively, the current may be measured from the voltage using the relationship between the voltage and the current stored in advance. At this time, the relationship between voltage and current may be stored as a lookup table or stored in a memory. The over current protection circuit 1000 may further include a storage unit (not shown) for storing information on the relationship between voltage and current.

When the second voltage is inputted, the control unit 1130 may determine that an over current has occurred, and may block the power input from the power source 1210. As previously described, when the first voltage is equal to or greater than the second voltage, the voltage detection unit 1120 outputs the second voltage, not the first voltage, to the control unit 1130. When the voltage applied from the voltage detection unit 1120 is the second voltage, the control unit 1130 may determine that the first voltage is equal to or greater than the second voltage, and may determine that overcurrent has occurred accordingly. However, when a voltage less than the second voltage is inputted, that is, when the first voltage is inputted, it may be determined that over current has not occurred.

When the control unit 1130 determines that an over current has occurred as the second voltage is inputted, the control unit 1130 may block the power input from the power source 1210 to protect other components. When over current occurs, since damage may occur to other components connected to the power source 1210 as well as the control unit 1130 due to over current, in order to protect internal circuits or components, the control unit 1130 may block the power input from the power source 1210. At this time, it is possible to generate an alarm that over current has occurred, or to transfer whether over current has occurred or whether the power source is blocked to a higher level control unit.

The switch 1140 blocks the power input from the power source 1210. The switch 1140 is formed at the foremost front end to which the power source 1210 is being inputted, and may block the power input from the power source 1210 when it is turned off. The switch 1140 may be configured as an FET. Other than this, it may be implemented using various switching devices.

When it is determined that over current has occurred, the control unit 1130 may turn off the switch 1140 to block the power input from the power source. The switch 1140 is turned on/off according to the control of the control unit 1130 according to the determination of the occurrence of over current of the control unit 1130. When the control unit 1130 determines that an over current is generated from the voltage detected by the voltage detection unit 1120, the power input from the power source 1210 may be blocked by turning off the switch 1140.

The charge pump 1150 may transform the voltage of the control signal to the switch 1140 of the control unit 1130. The charge pump is a device that steps up or step down the input voltage and outputs it, is a kind of DC-DC converter using capacitors. The charge pump can be manufactured in a small size by using a capacitor to store energy, and has high efficiency. The voltage of the control signal of the control unit 1130 may be transformed into a voltage suitable for controlling the switch 1140 by using the charge pump 1150.

The over current protection circuit according to the second embodiment of the present invention may be implemented as shown in FIG. 14. FIG. 14 shows an example of using a current mirror circuit as the current detection unit 1110, and the current mirror circuit may be implemented as in FIG. 14. The current that is inputted from the power source 1210 and flows through R2 flows to R3, and the same current flows through R1 and R4 by the mirror circuit structure being configured as 4 BJTs, and the voltage across R4 is outputted. The voltage applied to R4 is outputted to the voltage detection unit 1120, and the voltage detection unit 1120 may be implemented with a voltage detector. When the first voltage being outputted from the current detection unit 1110 is less than the second voltage, the voltage detection unit 1120 outputs the first voltage to the MCU which is the control unit 1130, and when the first voltage is equal to or greater than the second voltage, the second voltage is outputted to the control unit 1130 to protect the control unit 1130. The control unit 1130 measures the current by using the magnitude of the input voltage, and is protected as the voltage detection unit 1120 is outputting a voltage being limited to the second voltage. When the second voltage is inputted, the control unit 1130 determines that over current has occurred, and in order to block the over current, the switch 1140 for blocking the power input from the power source is controlled to be off. At this time, the control signal being outputted from the control unit 1130 is transformed for switch control through the charge pump 1150 and outputted to the switch 1140 to turn off the switch 1140. Here, the switch 1140 may be a B to B switch. Through this, it is possible to protect internal circuits or components such as a bridge circuit for driving a motor to which current is applied from the power source.

Figure 15:
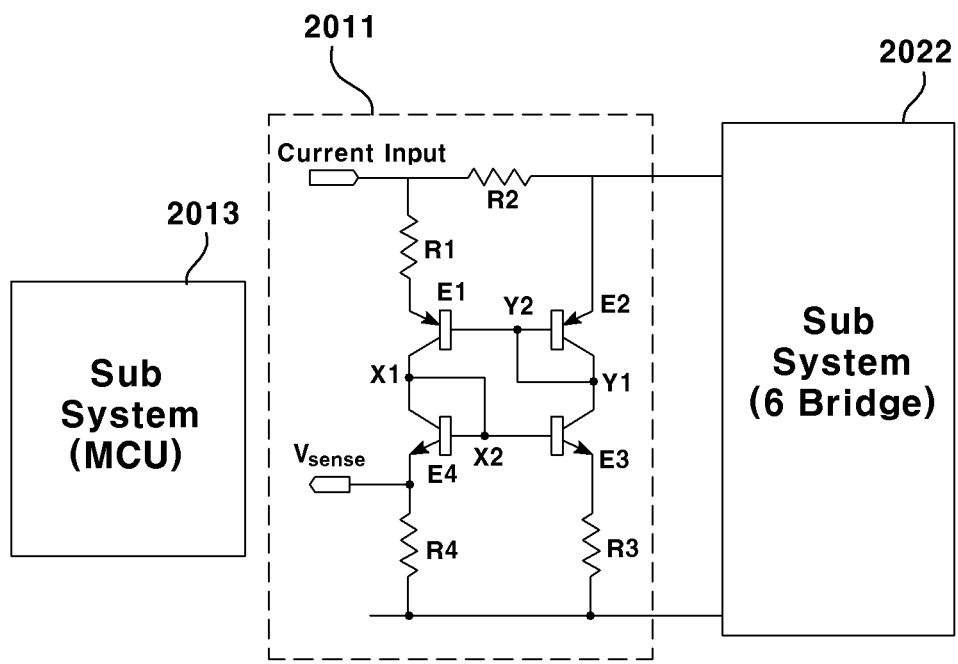
FIG. 15 shows a comparative example with an over current protection circuit according to an embodiment of a second embodiment of the present invention.

FIG. 15 is a comparative example of an over current protection circuit according to an embodiment of the second embodiment of the present invention, and the voltage being outputted from the current detection unit 2011 is directly outputted to MCU which is the control unit 2013 so that damages to the control unit 2013 may occur when an over current occurs. For example, when a current of 10 A flows and 1 V is set to be outputted, a voltage of 10 V is outputted when 100 A flows, and when the I/O terminal voltage of the MCU is 6 V or more, damage may occur. Therefore, when over current occurs, it is difficult to protect the MCU. In addition, even if over current occurs, it is difficult to protect over current because a switch that can block over current is not formed.

Figure 16:
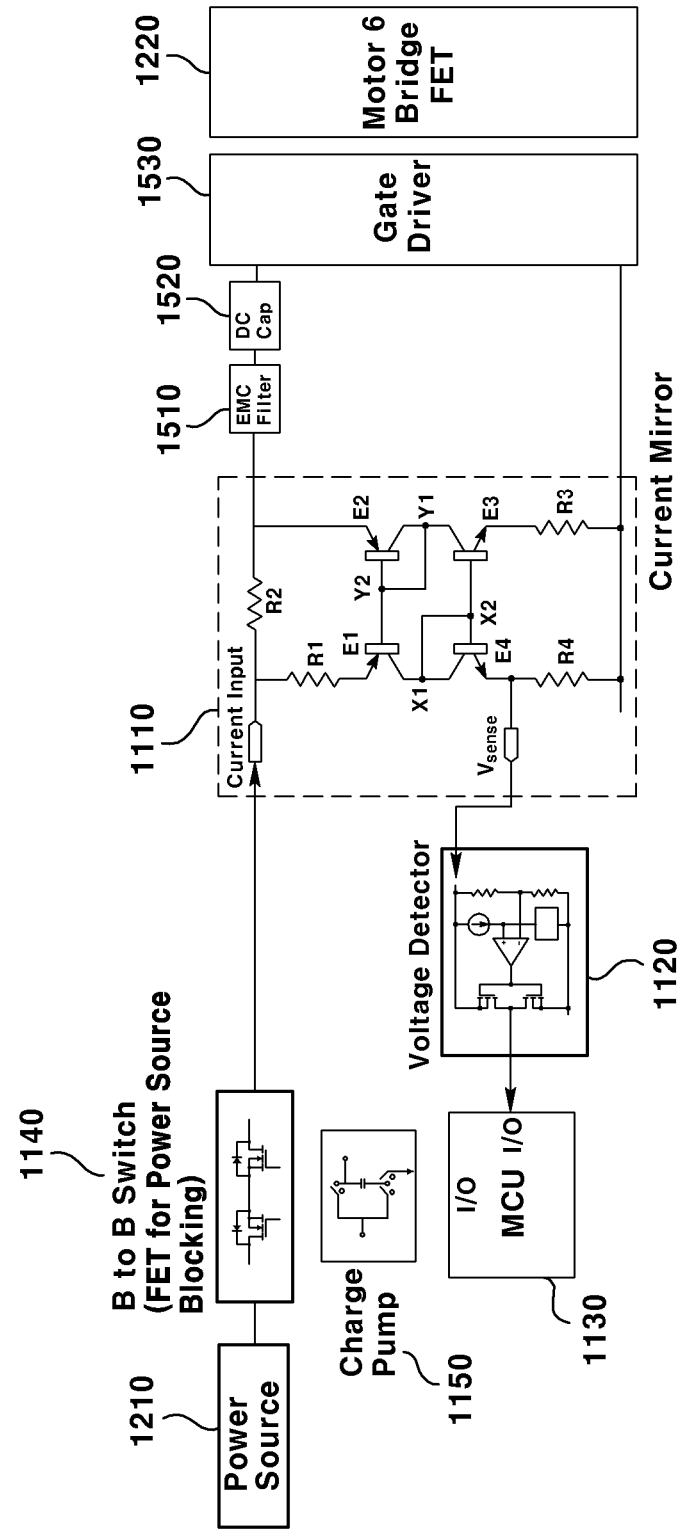
FIGS. 16 and 17 illustrates an embodiment in which an over current protection circuit according to an embodiment of a second embodiment of the present invention is implemented.
Figure 17:
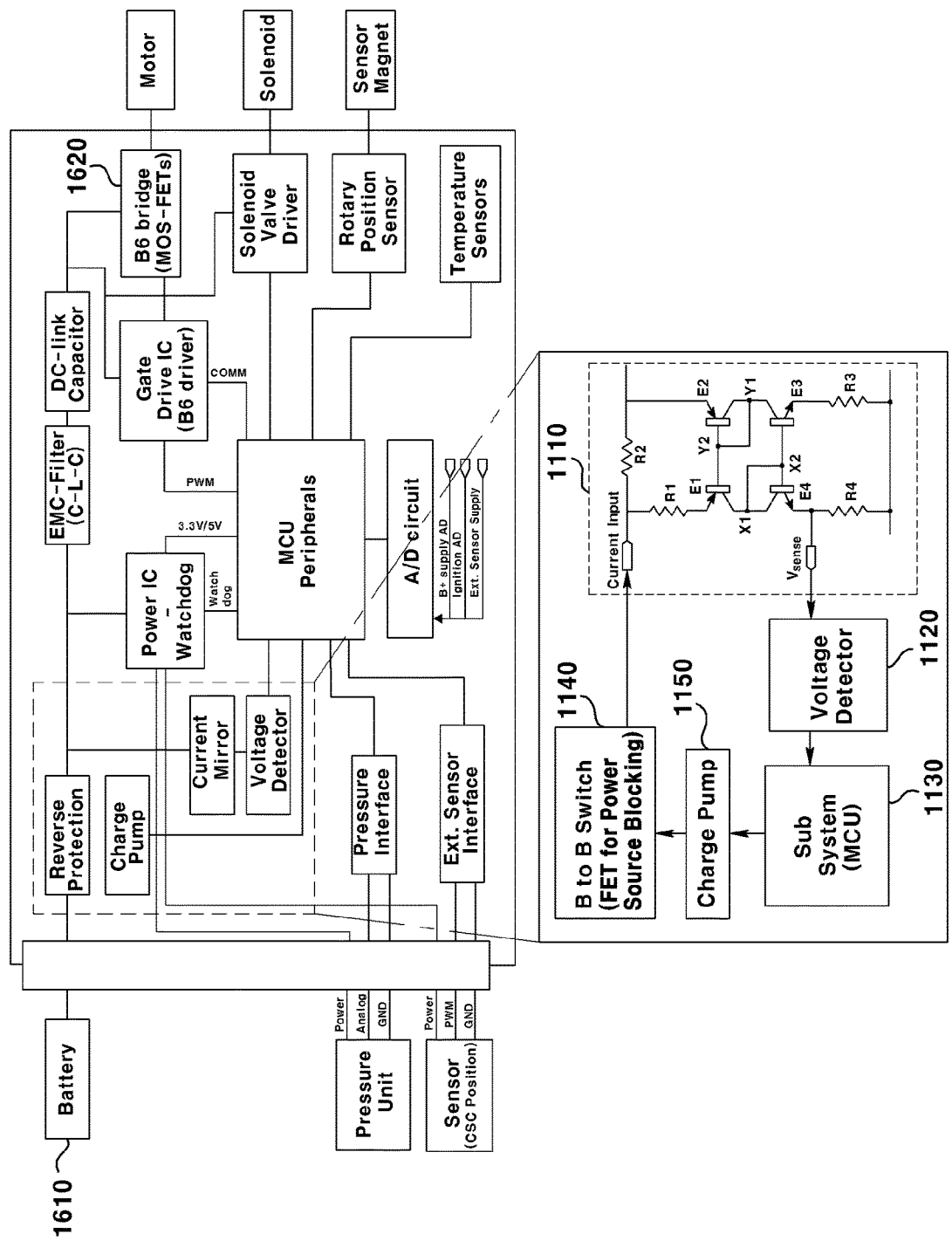

FIGS. 16 and 17 illustrates an embodiment in which an over current protection circuit according to an embodiment of a second embodiment of the present invention is implemented inside a vehicle, the current detection unit 1110, which is a current mirror circuit, detects the current being inputted from the battery power 1210, and the voltage detection unit 1120 detects the voltage and outputs the voltage limited to the second voltage to the control unit 1130 that is the MCU, and the control unit 1130 determines whether over current occurs according to the input voltage, and when an over current occurs, the power input from the power source 1210 is blocked by turning off the switch 1140 using a control signal being transformed through the charge pump. The input power being inputted from the power source 1210 is applied to the gate driver 1530 and the bridge circuit 1220 for driving the motor through the EMC filter 1510 and the DC capacitor 1520, and when an over current is detected, the switch 1140 is turned off, and an input of the over current to the gate driver 1530 and the motor driving bridge circuit 1220 is blocked, thereby protecting internal circuits or components.

The input power inputted from the power source 1210 is applied to the gate driver 1530 and the bridge circuit 1220 for driving the motor through the EMC filter 1510 and the DC capacitor 1520, when an over current is detected, the switch 1140 is turned off, and an input of the over current to the gate driver 1530 and the motor driving bridge circuit 1220 is blocked, thereby protecting internal circuits or components.

The over current protection circuit 1000 may be formed at the power input stage of the battery power 1610 of the motor driving ECU of the vehicle, as shown in FIG. 17. The battery power 1610 is inputted and is supplied to internal circuits and components, such as a power IC, a gate driver IC, and a B6 bridge circuit 1620 for driving a motor; and the over current protection circuit can protect internal circuits or components by measuring the current at the input terminal of the battery power and quickly blocking the power input from the power source when over current occurs.

Figure 18:
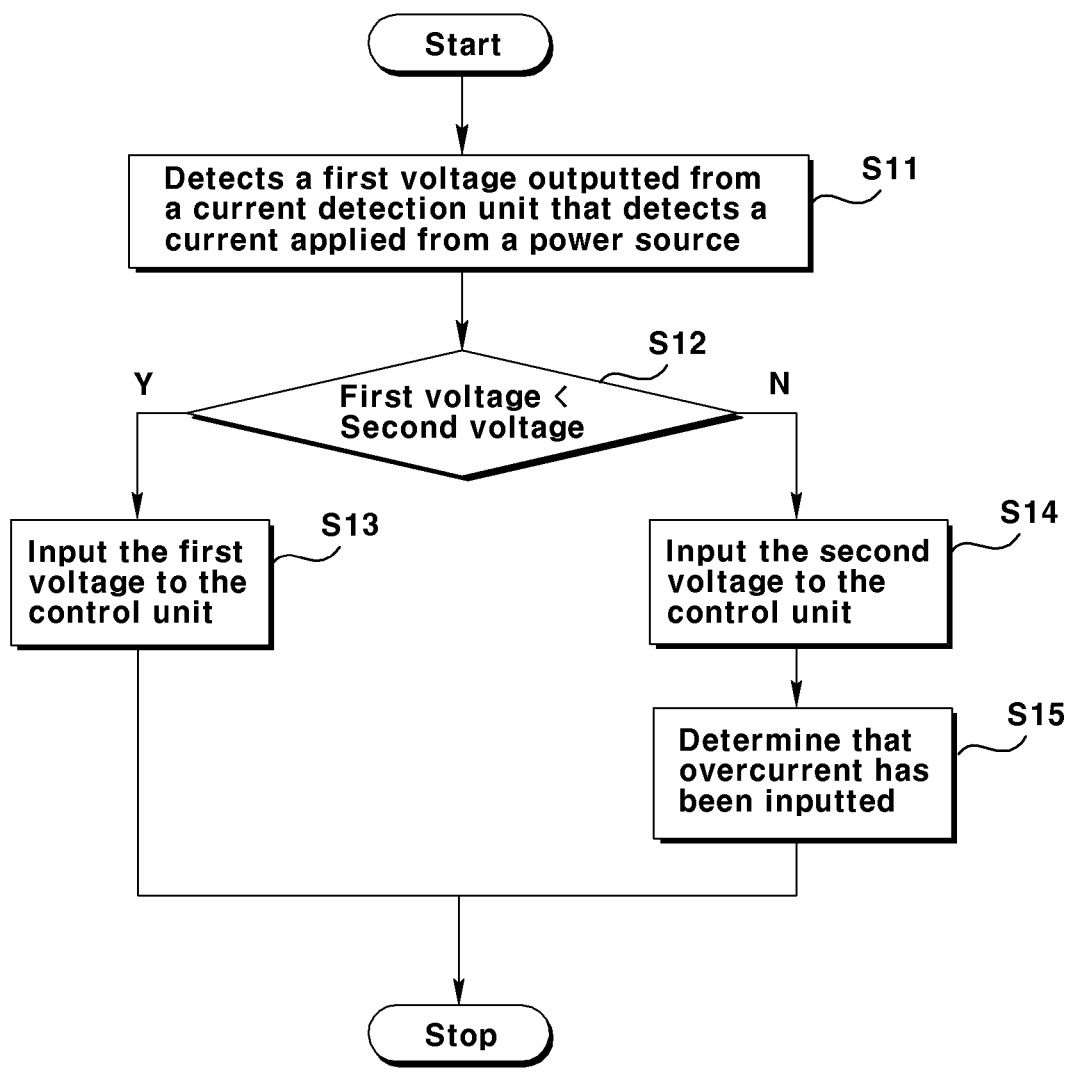
FIG. 18 is a flowchart of an over current protection method according to an embodiment of a second embodiment of the present invention.
Figure 19:
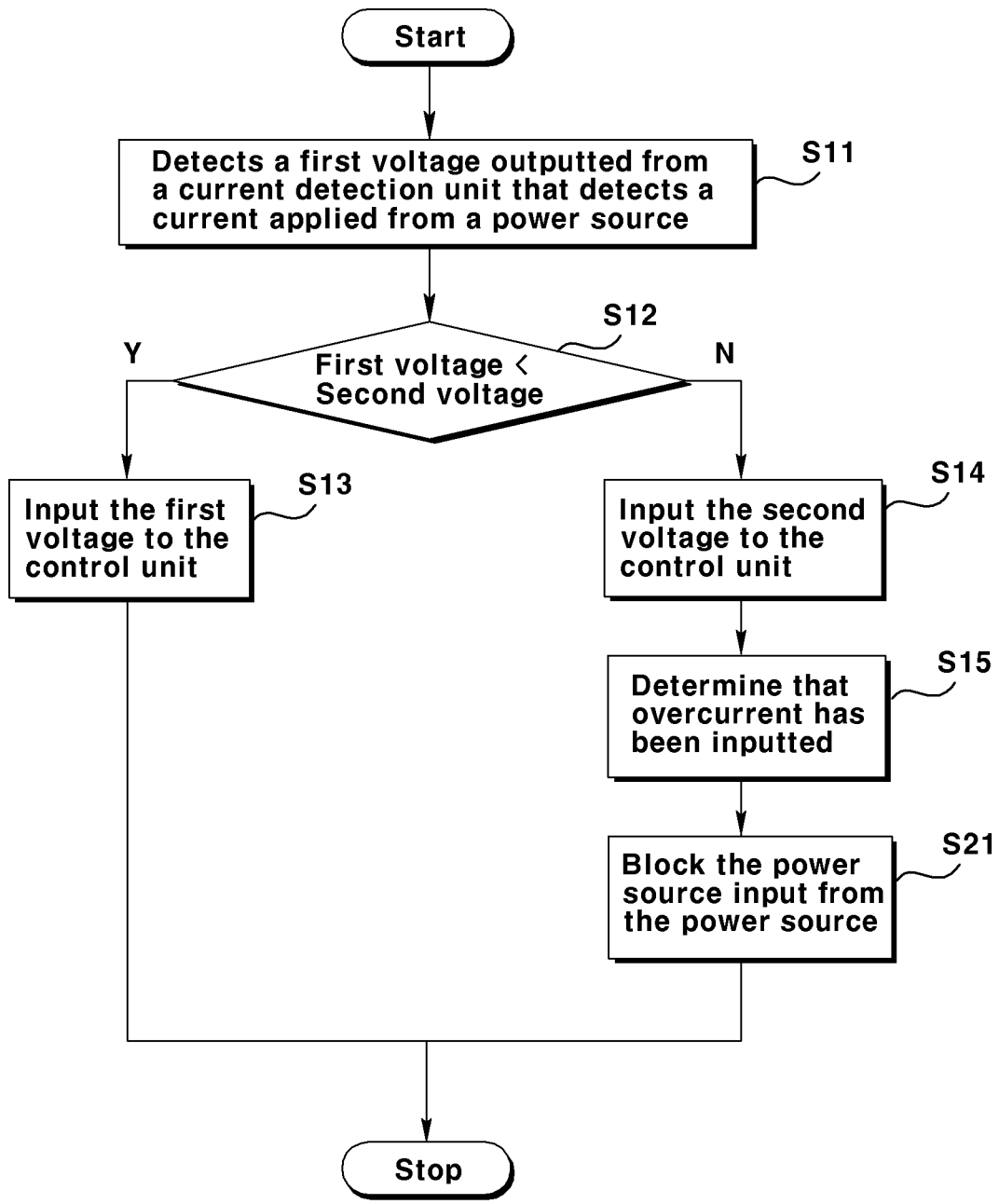
FIG. 19 is a flowchart of an over current protection method according to another embodiment of a second embodiment of the present invention.

FIG. 18 is a flowchart of an over current protection method according to an embodiment of a second embodiment of the present invention; and FIG. 19 is a flowchart of an over current protection method according to another embodiment of a second embodiment of the present invention. The detailed description of each step of FIGS. 18 and 19 corresponds to the detailed description of the over current protection circuit of FIGS. 12 to 17, and thus the overlapping description will be omitted.

In step S11, a first voltage being outputted from a current detection unit for detecting the current being applied from the power source is detected. The current detection unit may be a current mirror circuit or a shunt resistor. Thereafter, the first voltage and a second voltage are compared in step S12. As a result of the comparison in step S12, when the first voltage is less than the second voltage, the first voltage is inputted to the control unit in step S13. As a result of the comparison in step S12, when the first voltage is equal to or greater than the second voltage, the second voltage is input to the control unit in step S14, and when the second voltage is inputted in step S15, it is determined that over current is generated or inputted.

When it is determined that the over current has occurred in step S15, the power input from the power source may be blocked in step S21.

A modified embodiment according to the present embodiment may include some configurations of a first embodiment and some configurations of a second embodiment together. That is, the modified embodiment may include the first embodiment, but some configurations of the first embodiment may be omitted and may include some configurations of the corresponding second embodiment. Or, a modified embodiment may include a second embodiment, but some components of the second embodiment are omitted, and may include some components of the corresponding first embodiment.

Features, structures, effects, and the like described in the above embodiments are included in at least one embodiment, and are not necessarily limited to only one embodiment. Furthermore, features, structures, effects, and the like illustrated in each embodiment can be combined or modified for other embodiments by those of ordinary skill in the art to which the embodiments belong. Accordingly, the contents related to such combinations and variations should be interpreted as being included in the scope of the embodiments.

Meanwhile, the embodiments of the present invention can be implemented as computer-readable codes on a computer-readable recording medium. The computer-readable recording medium includes all types of recording devices in which data readable by a computer system is stored.

As examples of computer-readable recording media there are ROM, RAM, CD-ROM, magnetic tape, floppy disk, and optical data storage devices, and in addition, they are distributed across networked computer systems in a distributed manner in which computer-readable code can be stored and executed. And functional programs, codes, and code segments for implementing the present invention can be easily inferred by programmers in the technical field to which the present invention pertains.

As described above, in the present invention, specific matters such as specific components, and the like; and limited embodiments and drawings have been described, but these are only provided to help a more general understanding of the present invention, and the present invention is not limited to the above embodiments, and various modifications and variations are possible from these descriptions by those of ordinary skill in the art to which the present invention belongs.

Therefore, the spirit of the present invention should not be limited to the described embodiments, and not only the claims to be described later, but also all those with equivalent or equivalent modifications to the claims will be said to belong to the scope of the spirit of the present invention.

The invention claimed is:

1. A voltage monitoring circuit comprising:
   a clamping unit configured to clamp voltage of an input power inputted from a power source with a reference voltage and outputs it to an MCU; and
   a switch unit configured to block the input power from the power source when an abnormality occurs in the reference voltage of the clamping unit.

2. The voltage monitoring circuit according to claim 1, wherein the clamping unit receives the reference voltage having a predetermined voltage level from a voltage supply unit.

3. The voltage monitoring circuit according to claim 2, wherein the switch unit blocks the input power from the power source to block power applied to the voltage supply unit.

4. The voltage monitoring circuit according to claim 1, further comprising:
   a voltage divider unit connected to a front end of the clamping unit to divide the voltage of the input power.

5. The voltage monitoring circuit according to claim 1, further comprising:
   a low pass filter connected to a front end of the clamping unit to filter the input power.

6. A voltage monitoring circuit comprising:
   a first power input unit and a second power input unit configured to receive a battery power;
   a first switch unit connected to the first power input unit, and a second switch unit connected to the second power input unit; and
   a first clamping unit configured to clamp voltage of an input power being inputted through the first power input unit and the first switch unit with a first reference voltage, and a second clamping unit configured to clamp voltage of an input power being inputted through the second power input unit and the second switch unit with a second reference voltage,
   wherein the first switch unit blocks the input power from the first power input unit when an abnormality occurs in the first reference voltage of the first clamping unit, and
   wherein the second switch unit blocks the input power from the second power input unit when an abnormality occurs in the second reference voltage of the second clamping unit.

7. The voltage monitoring circuit according to claim 6, wherein the first clamping unit and the second clamping unit receive the first and second reference voltages, respectively, each having a predetermined voltage level from a voltage supply unit through a separate connection line.

8. The voltage monitoring circuit according to claim 6, wherein one of the first switch unit and the second switch unit comprises a transistor, and the other one comprises a MOSFET.

9. The voltage monitoring circuit according to claim 6, wherein it is determined whether an abnormality in the first reference voltage of the first clamping unit or the second reference voltage of the second clamping unit occurs by comparing a voltage clamped in the first clamping unit with a voltage clamped in the second clamping unit; and
   wherein when an abnormality occurs in the first reference voltage of the first clamping unit or the second reference voltage of the second clamping unit, the first switch unit or the second switch unit connected to the first clamping unit or the second clamping unit in which the abnormality occurs is turned off.

10. The voltage monitoring circuit according to claim 6, wherein the first clamping unit and the second clamping unit output the clamped voltage to an MCU.

11. The voltage monitoring circuit according to claim 1, wherein the clamping unit limits the input power as the reference voltage.

12. The voltage monitoring circuit according to claim 1, wherein the switch unit is composed of a transistor or a MOSFET.

13. The voltage monitoring circuit according to claim 2, wherein the power source is a battery.

14. The voltage monitoring circuit according to claim 6, wherein the first switch unit comprises a transistor, and the second switch unit comprises a MOSFET.

15. The voltage monitoring circuit according to claim 6, wherein the first switch unit comprises a PMOS, and the second switch unit comprises a NMOS.

16. The voltage monitoring circuit according to claim 6, wherein the first clamping unit and the second clamping unit limit the input power as the first and second reference voltage, respectively.

17. The voltage monitoring circuit according to claim 6, wherein the first reference voltage of the first clamping unit is different from the second reference voltage of the second clamping unit.

18. The voltage monitoring circuit according to claim 6, comprising:
    a controller that receives the clamped voltage from the first clamping unit and monitors a voltage of the battery power.

19. The voltage monitoring circuit according to claim 18, wherein the controller determines whether an abnormality in the voltage of the battery power occurs, by comparing the clamped voltage in the first clamping unit with the clamped voltage in the second clamping unit.

20. A voltage monitoring circuit comprising:
    a plurality of power input units configured to receive battery power;
    a plurality of switch units respectively connected to each of the plurality of power input units; and
    a plurality of clamping units respectively connected to each of the plurality of switch units and configured to clamp a voltage of the input power being inputted through the power input unit and the switch unit with a reference voltage,
    wherein each switch unit comprises a different type of switch, and blocks the input power from the power input unit connected to the clamping unit when an abnormality occurs in the reference voltage of the respectively connected clamping unit.

* * * * *